(12) United States Patent
Chen et al.

(10) Patent No.: US 11,558,042 B2
(45) Date of Patent: Jan. 17, 2023

(54) MULTI-PHASE SIGNAL CONTROL CIRCUIT AND METHOD

(71) Applicant: HUAWEI TECHNOLOGIES CO., LTD., Guangdong (CN)

(72) Inventors: Yue Chen, Chengdu (CN); Jiake Wang, Shenzhen (CN); Liang Chen, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/504,368

(22) Filed: Oct. 18, 2021

(65) Prior Publication Data

US 2022/0038082 A1    Feb. 3, 2022

Related U.S. Application Data

(63) Continuation of application No. PCT/CN2019/083307, filed on Apr. 18, 2019.

(51) Int. Cl.
*H03K 3/03* (2006.01)
*H03K 3/037* (2006.01)
*H03K 19/20* (2006.01)
*H03K 5/00* (2006.01)

(52) U.S. Cl.
CPC ......... *H03K 5/00006* (2013.01); *H03K 3/037* (2013.01); *H03K 3/0315* (2013.01); *H03K 19/20* (2013.01); *H03K 2005/00078* (2013.01)

(58) Field of Classification Search
CPC .. H03K 5/00006; H03K 3/0315; H03K 3/037; H03K 19/20; H03K 2005/00078; H03K 5/1515; H02M 1/14; H02M 3/07; H02M 1/084; H02M 3/077; H02M 1/08
USPC .................................. 327/172, 173, 174, 175
See application file for complete search history.

(56) References Cited

U.S. PATENT DOCUMENTS

| | | | |
|---|---|---|---|
| 3,944,856 A * | 3/1976 | Horie ..................... | H02M 3/137 363/124 |
| 6,342,822 B1 * | 1/2002 | So .......................... | H02M 3/156 320/145 |
| 7,342,383 B1 | 3/2008 | Song et al. | |
| 8,174,302 B2 * | 5/2012 | Fujiwara ................ | H03K 3/017 327/175 |
| 2005/0088151 A1 | 4/2005 | Tzeng et al. | |
| 2005/0110472 A1 | 5/2005 | Harris et al. | |
| 2008/0246523 A1 * | 10/2008 | Murakami ............... | H03K 7/08 327/175 |

(Continued)

FOREIGN PATENT DOCUMENTS

| CN | 1841907 A | 10/2006 |
|---|---|---|
| CN | 201118434 Y | 9/2008 |

(Continued)

*Primary Examiner* — John W Poos

(57) ABSTRACT

A multi-phase signal control circuit includes: a comparator, configured to compare a triangular wave signal with a feedback control signal to output a first pulse width modulation signal, where the feedback control signal is a signal fed back by the power stage circuit; a phase switch circuit, configured to receive a phase switch signal and the first pulse width modulation signal to generate a first phase signal and a second phase signal, where the first phase signal and the second phase signal are used to control the power stage circuit to generate an output voltage signal.

20 Claims, 19 Drawing Sheets

(56) References Cited

U.S. PATENT DOCUMENTS

| | | |
|---|---|---|
| 2009/0121781 A1 | 5/2009 | Oyama et al. |
| 2010/0289547 A1 | 11/2010 | Crofts |
| 2012/0105038 A1 | 5/2012 | Chen et al. |
| 2012/0176105 A1 | 7/2012 | Chang et al. |
| 2012/0274394 A1 | 11/2012 | Chan |
| 2013/0038312 A1 | 2/2013 | Wang |
| 2013/0278231 A1* | 10/2013 | Kuo .................... H02M 3/156 327/175 |

FOREIGN PATENT DOCUMENTS

| | | |
|---|---|---|
| CN | 101488712 A | 7/2009 |
| CN | 104617931 A | 5/2015 |
| CN | 105048808 A | 11/2015 |
| JP | 2009124824 A | 6/2009 |
| TW | 201216600 A | 4/2012 |

\* cited by examiner

MULTI-PHASE SIGNAL CONTROL CIRCUIT AND METHOD

CROSS-REFERENCE TO RELATED APPLICATIONS

This application is a continuation of International Application No. PCT/CN2019/083307, filed on Apr. 18, 2019, the disclosure of which is hereby incorporated by reference in its entirety.

TECHNICAL FIELD

The present disclosure relates to the field of electronic technologies, and in particular, to a multi-phase signal control circuit and method.

BACKGROUND

A voltage converter is a circuit topology that converts an input voltage into an output voltage based on a voltage requirement, and generally includes an inductor-based voltage converter and a switched capacitor (SC)—based voltage converter. The switched capacitor-based voltage converter with a capacitor as its main power device is widely used in more and more scenarios by virtue of high power density, a fast response speed, high efficiency, and the like. The switched capacitor-based voltage converter is implemented using a charge-discharge working cycle of the capacitor. However, because a charge time limits a continuous output capability of the voltage converter and an output ripple, two-phase or multi-phase alternate working is usually used to ensure output stability.

In a switched capacitor-based voltage converter in a conventional technology shown in FIG. 1, the following processing is performed: A triangular wave signal and a feedback control signal that is determined by an error between an actual output voltage and an ideal output voltage are usually used as inputs to a comparator, to generate a pulse width modulation (PWM) signal that controls an output power. A frequency divider performs frequency reduction processing on the PWM signal. Then, a frequency-reduced signal and the PWM signal are processed by an AND gate to obtain a multi-phase signal. The frequency-reduced signal is also processed by a NOT gate, and then is processed by another AND gate with the PWM signal, to obtain another phase signal. FIG. 2 is a signal timing diagram corresponding to FIG. 1. An example in which a multi-phase signal includes a P1 signal and a P2 signal is used for description. A P1 working allowed signal represents a signal obtained after frequency reduction processing is performed on a PWM signal. A P2 working allowed signal represents a signal obtained after a logical NOT operation is performed on the P1 working allowed signal. A logical AND operation is performed on the P1 working allowed signal and the PWM signal to generate the P1 signal. A logical AND operation is performed on the P2 working allowed signal and the PWM signal to generate the P2 signal. The P1 signal and the P2 signal ensure stability of an output of the voltage converter by controlling alternate charge and discharge.

However, the foregoing method of directly performing down-frequency processing on the PWM signal to generate a working allowed signal of each phase is only applicable to a case in which an on-off cycle controlled by the PWM signal is stable. When the on-off cycle controlled by the PWM signal is unstable, an on-off cycle controlled by a signal obtained after frequency division performed by the frequency divider is also unstable. Therefore, the P1 signal and the P2 signal that are generated using the PWM signal and the frequency-divided PWM signal may not meet a normal working condition of a downstream power stage circuit, causing abnormal working of the power stage circuit, for example, locking or other reliability problems.

SUMMARY

The present disclosure provides a multi-phase signal control circuit and method, to resolve a problem in the conventional technology that a power stage circuit works abnormally when an on-off cycle controlled by a PWM signal is unstable.

According to a first aspect, a multi-phase signal control circuit is provided, including: a signal generation circuit, configured to generate a triangular wave signal and a phase switch signal; a comparator, configured to compare the triangular wave signal with a feedback control signal to output a first pulse width modulation PWM signal, where the feedback control signal is a signal fed back by a power stage circuit; and a phase switch circuit, configured to receive the phase switch signal and the first pulse width modulation signal to generate a first phase signal and a second phase signal, where the first phase signal and the second phase signal are used to control the power stage circuit to generate an output voltage signal.

In the foregoing technical solution, the phase switch signal generated by the signal generation circuit in the multi-phase signal control circuit does not depend on the first PWM signal. In other words, the phase switch signal is not affected by a change in an on-off cycle controlled by the first PWM signal. Therefore, when the on-off cycle controlled by the first PWM signal is unstable, the phase switch signal can still stably control the phase switch circuit to generate the first phase signal and the second phase signal, where the first phase signal and the second phase signal can meet a normal working condition of a downstream power stage circuit. Therefore, the power stage circuit can work normally, and performance of the multi-phase signal control circuit is improved.

In a possible implementation of the first aspect, the signal generation circuit includes: a signal generator, configured to generate the triangular wave signal and a trigger signal having a same frequency as the triangular wave signal; and a frequency divider, configured to perform frequency division processing on the trigger signal to obtain the phase switch signal. Optionally, a position of a transition edge of the trigger signal corresponds to a position of a peak or a valley of the triangular wave signal. In the foregoing possible implementation, based on different frequency requirements, the signal generation circuit may perform, through the frequency divider, corresponding frequency division processing on the trigger signal generated by the signal generator, to obtain a phase switch signal that meets the frequency requirement. This improves accuracy of generating the phase switch signal.

In a possible implementation of the first aspect, the multi-phase signal control circuit further includes: a latch, configured to latch the first pulse width modulation signal to generate a second pulse width modulation signal, and output the second pulse width modulation signal to the phase switch circuit. In the foregoing possible implementation, the first pulse width modulation signal is latched to generate the second pulse width modulated signal. This further ensures that a charge/discharge time of a multi-phase signal generated by the phase switch circuit can meet the normal working condition of the power stage circuit, and therefore ensures a loading capability of a voltage converter and stability of an output ripple.

In a possible implementation of the first aspect, the phase switch circuit includes: a first AND gate, configured to perform a logical AND operation on the phase switch signal and the second pulse width modulation signal to output the first phase signal; a first NOT gate, configured to perform a logical NOT operation on the phase switch signal; and a second AND gate, configured to perform a logical AND operation on a signal obtained after the logical NOT operation and the second pulse width modulation signal, to output the second phase signal. The phase switch circuit provided in the foregoing possible implementation has a simple and effective structure, so that a structure of the multi-phase signal control circuit can be simplified to some extent.

In a possible implementation of the first aspect, the signal generator includes a ring oscillator, a buffer, a first delay circuit, and an integrator circuit, where the ring oscillator is configured to generate an oscillation signal; the buffer is configured to buffer the oscillation signal to output a clock signal; the first delay circuit is configured to delay the clock signal by a first phase to output the trigger signal; and the integrator circuit is configured to perform integration processing on the trigger signal to output the triangular wave signal. Alternatively, the signal generator includes a relaxation oscillator and a first delay circuit, where the relaxation oscillator is configured to generate a clock signal, and generate the triangular wave signal based on the clock signal; and the first delay circuit is configured to receive the clock signal, and delay the clock signal by a first phase to output the trigger signal. The foregoing possible implementation can improve diversity and flexibility in design of the signal generator, and can further improve diversity and flexibility in design of the multi-phase signal control circuit.

In a possible implementation of the first aspect, the signal generator is further configured to: generate a pulse hold signal, and output the pulse hold signal to an enable end of the latch, where a position of a high-level pulse width of the pulse hold signal corresponds to a position of a high-level pulse width of the trigger signal. In the foregoing possible implementation, when an edge of the phase switch signal coincides with a high-level pulse width of the first pulse width modulation signal, it can be ensured that the first phase signal and the second phase signal generated by the phase switch circuit can meet the normal working requirement of the power stage circuit.

In a possible implementation of the first aspect, the signal generator further includes a second delay circuit and a D flip-flop. The second delay circuit is configured to delay the clock signal by a second phase to output a clock delay signal, where the second phase is equal to twice the first phase. The D flip-flop is configured to receive the clock signal through a clock input, receive the clock delay signal through a set input, and generate the pulse hold signal based on the clock signal and the clock delay signal. Alternatively, the signal generator further includes a second delay circuit and a logical operation circuit. The second delay circuit is configured to delay the clock signal by a second phase to output a clock delay signal, where the second phase is equal to twice the first phase. The logical operation circuit is configured to perform a logical NOT operation on the clock delay signal, and perform a logical AND operation on a signal obtained after the logical NOT operation and the clock signal, to generate the pulse hold signal. The foregoing possible implementation can further improve diversity and flexibility in design of the signal generator, and can further improve diversity and flexibility in design of the multi-phase signal control circuit.

In a possible implementation of the first aspect, the high-level pulse width of the pulse hold signal is equal to any one of the following: twice a minimum off-time, twice a minimum on-time, or twice a larger value between a minimum off-time and a minimum on-time. In the foregoing possible implementation, the signal generator can flexibly set the high-level pulse width of the pulse hold signal based on an actual requirement, and this improves accuracy of the generated pulse hold signal.

In a possible implementation of the first aspect, a frequency of the phase switch signal is N times a frequency of the triangular wave signal, where N is an integer greater than or equal to 1; and a result of logical OR processing performed on the first phase signal and the second phase signal is the first pulse width modulation signal. In the foregoing possible implementations, the first phase signal and the second phase signal that are generated by the phase switch circuit can meet the normal working requirement of the power stage circuit, and performance of the multi-phase signal control circuit can be improved.

According to a second aspect, a multi-phase signal control circuit is provided, including: a signal generation circuit, configured to generate a triangular wave signal and a phase switch signal, where a frequency of the phase switch signal is N times a frequency of the triangular wave signal, and N is an integer greater than or equal to 1; a comparator, configured to compare the triangular wave signal with a feedback control signal to output a first pulse width modulation PWM signal, where the feedback control signal is a signal fed back by a power stage circuit; and a phase switch circuit, configured to perform phase switching processing on the first pulse width modulation signal using the phase switch signal to obtain a first phase signal and a second phase signal, where a result of logical OR processing performed on the first phase signal and the second phase signal is the first pulse width modulation signal, and the first phase signal and the second phase signal are used to control the power stage circuit to generate an output voltage signal. In the foregoing technical solution, the phase switch signal generated by the signal generation circuit in the multi-phase signal control circuit does not depend on the first PWM signal. In other words, the phase switch signal is not affected by a change in an on-off cycle controlled by the first PWM signal. Therefore, when the on-off cycle controlled by the first PWM signal is unstable, the phase switch signal can still stably control the phase switch circuit to generate the first phase signal and the second phase signal that control alternate charge and discharge. The first phase signal and the second phase signal can meet a normal working condition of a downstream power stage circuit, so that the power stage circuit can normally generate a stable output voltage signal, and can also ensure a loading capability of a voltage converter and stability of an output ripple.

In a possible implementation of the second aspect, the signal generating circuit includes: a signal generator is configured to generate the triangular wave signal and a trigger signal having a same frequency as the triangular wave signal; and a frequency divider, configured to perform frequency division processing on the trigger signal to obtain the phase switch signal, where a position of a transition edge of the trigger signal corresponds to a position of a peak or a valley of the triangular wave signal. In the foregoing possible implementation, based on different frequency requirements, the signal generation circuit may perform, through the frequency divider, corresponding frequency division processing on the trigger signal generated by the signal generator, to obtain a phase switch signal that meets the frequency requirement. This improves accuracy of generating the phase switch signal.

In a possible implementation of the second aspect, the multi-phase signal control circuit further includes: a latch, configured to latch the first pulse width modulation signal to generate a second pulse width modulation signal, and output the second pulse width modulation signal to the phase switch circuit. Optionally, the signal generator is further configured to generate a pulse hold signal, where a position of a high-level pulse width of the pulse hold signal may correspond to a position of a high-level pulse width of the trigger signal. The high-level pulse width of the pulse hold signal may be greater than or equal to the high-level pulse width of the trigger signal at the corresponding position. The latch is configured to latch the first pulse width modulation signal based on the pulse hold signal, to output the second pulse width modulation signal. In the foregoing possible implementation, the first pulse width modulation signal is latched using the pulse hold signal, to output the second pulse width modulation signal. Therefore, it can be ensured that a charge/discharge time of a multi-phase signal generated using the second pulse width modulation signal can meet a requirement for a minimum off-time and a minimum on-time in the power stage circuit. In this way, a loading capability of the voltage converter and stability of an output ripple are ensured.

In a possible implementation of the second aspect, the high-level pulse width of the pulse hold signal is equal to any one of the following: twice a minimum off-time, twice a minimum on-time, or twice a larger value between a minimum off-time and a minimum on-time. In the foregoing possible implementation, the signal generator can flexibly set the high-level pulse width of the pulse hold signal based on an actual requirement, and this improves accuracy of the generated pulse hold signal.

In a possible implementation of the second aspect, the phase switch circuit includes: a first AND gate, configured to perform a logical AND operation on the phase switch signal and the second pulse width modulation signal to output the first phase signal; a first NOT gate, configured to perform a logical NOT operation on the phase switch signal; and a second AND gate, configured to perform a logical AND operation on a signal obtained after the logical NOT operation and the second pulse width modulation signal, to output the second phase signal. In the foregoing possible implementation, phase switching is performed on the second pulse width modulation signal using the phase switch signal, and a charge/discharge time of a generated multi-phase signal can meet a requirement for a minimum off-time and a minimum on-time in the power stage circuit. In this way, the loading capability of the voltage converter and stability of the output ripple are ensured.

In a possible implementation of the second aspect, the signal generator includes a ring oscillator, a buffer, a first delay circuit, and an integrator circuit, where the ring oscillator is configured to generate an oscillation signal; the buffer is configured to buffer the oscillation signal to output a clock signal; the first delay circuit is configured to delay the clock signal by a first phase to output the trigger signal; and the integrator circuit is configured to perform integration processing on the trigger signal to output the triangular wave signal. Alternatively, the signal generator includes a relaxation oscillator and a first delay circuit, where the relaxation oscillator is configured to generate a clock signal, and generate the triangular wave signal based on the clock signal; and the first delay circuit is configured to receive the clock signal, and delay the clock signal by a first phase to output the trigger signal. The foregoing possible implementation can improve diversity and flexibility in design of the signal generator, and can further improve diversity and flexibility in design of the multi-phase signal control circuit.

In a possible implementation of the second aspect, the signal generator further includes a second delay circuit and a D flip-flop. The second delay circuit is configured to delay the clock signal by a second phase to output a clock delay signal, where the second phase is equal to twice the first phase. The D flip-flop is configured to receive the clock signal through a clock input, receive the clock delay signal through a set input, and generate the pulse hold signal based on the clock signal and the clock delay signal. Alternatively, the signal generator further includes a second delay circuit and a logical operation circuit. The second delay circuit is configured to delay the clock signal by a second phase to output a clock delay signal, where the second phase is equal to twice the first phase. The logical operation circuit is configured to perform a logical NOT operation on the clock delay signal, and perform a logical AND operation on a signal obtained after the logical NOT operation and the clock signal, to generate the pulse hold signal. The foregoing possible implementation can further improve diversity and flexibility in design of the signal generator, and can further improve diversity and flexibility in design of the multi-phase signal control circuit.

According to a third aspect, a multi-phase signal control method is provided. The method includes: generating a triangular wave signal and a phase switch signal, where a frequency of the phase switching signal is N times a frequency of the triangular wave signal, and N is an integer greater than or equal to 1; comparing the triangular wave signal with a feedback control signal to output a first pulse width modulation signal, the feedback control signal is related to an error between an output voltage signal and a preset voltage signal; and performing phase switching processing on the first pulse width modulation signal using the phase switch signal to obtain a first phase signal and a second phase signal, where a result of logical OR processing performed on the first phase signal and the second phase signal is the first pulse width modulation signal, and the first phase signal and the second phase signal are used to generate the output voltage signal.

In a possible implementation of the third aspect, the generating a triangular wave signal and a phase switch signal includes: generating the triangular wave signal and a trigger signal having a same frequency as the triangular wave signal; and performing frequency division processing on the trigger signal to obtain the phase switch signal, where a position of a transition edge of the trigger signal corresponds to a position of a peak or a valley of the triangular wave signal.

In a possible implementation of the third aspect, the method further includes: latching the first pulse width modulation signal to output a second pulse width modulation signal. Correspondingly, the performing phase switching processing on the first pulse width modulation signal using the phase switch signal to obtain a first phase signal and a second phase signal is specifically: performing phase switching processing on the second pulse width modulation signal using the phase switch signal, to obtain the first phase signal and the second phase signal. Optionally, the method further includes: generating a pulse hold signal, where a position of a high-level pulse width of the pulse hold signal corresponds to a position of a high-level pulse width of the trigger signal. Correspondingly, the latching the first pulse width modulation signal to output a second pulse width modulation signal includes: latching the first pulse width modulation signal based on the pulse hold signal, to output the second pulse width modulation signal.

In a possible implementation of the third aspect, the high-level pulse width of the pulse hold signal is equal to any one of the following: twice a minimum off-time, twice a minimum on-time, or twice a larger value between a minimum off-time and a minimum on-time.

In a possible implementation of the third aspect, the performing phase switching processing on the pulse width modulation signal using the phase switch signal, to obtain the first phase signal and the second phase signal includes: performing a logical AND operation on the phase switch signal and the second pulse width modulation signal to output the first phase signal; and performing a logical NOT operation on the phase switch signal, and performing a logical AND operation on a signal obtained after the logical NOT operation and the second pulse width modulation signal, to output the second phase signal.

In a possible implementation of the third aspect, the generating the triangular wave signal and a trigger signal having a same frequency as the triangular wave signal includes: generating an oscillation signal; buffering the oscillation signal to output a clock signal; delaying the clock signal by a first phase to output the trigger signal; and performing integration processing on the trigger signal to output the triangular wave signal.

Alternatively, the generating the triangular wave signal and a trigger signal having a same frequency as the triangular wave signal include: generating a clock signal, and generating the triangular wave signal based on the clock signal; and delaying the clock signal by a first phase to output the trigger signal.

In a possible implementation of the third aspect, the generating a pulse hold signal includes: delaying the clock signal by a second phase, to output a clock delay signal, where the second phase is equal to twice the first phase; and generating the pulse hold signal based on the clock signal and the clock delay signal.

According to a fourth aspect, a voltage converter is provided. The voltage converter includes: a power stage circuit, and the multi-phase signal control circuit according to any one of the first aspect or the possible implementations of the first aspect. The multi-phase signal control circuit is configured to generate a first phase signal and a second phase signal based on a feedback control signal, and the power stage circuit is configured to generate an output voltage signal based on the first phase signal and the second phase signal.

According to a fifth aspect, a voltage converter chip is provided, where the voltage converter chip includes the multi-phase signal control circuit according to any one of the first aspect or the possible implementations of the first aspect.

According to a sixth aspect, a voltage converter chip is provided. The voltage converter chip includes a power stage circuit and the multi-phase signal control circuit according to any one of the first aspect or the possible implementations of the first aspect. The multi-phase signal control circuit is configured to generate a first phase signal and a second phase signal based on a feedback control signal, and the power stage circuit is configured to generate an output voltage signal based on the first phase signal and the second phase signal.

According to a seventh aspect, a communications device is provided. The device may be a terminal or a base station. The communications device includes a processing chip and the voltage converter chip provided in the sixth aspect, where the voltage converter chip is configured to supply power to the processing chip.

It may be understood that any multi-phase signal control method, the voltage converter, the voltage converter chip, the communications device, and the like provided above may be implemented by the corresponding multi-phase signal control circuit provided above. Therefore, for beneficial effects that can be achieved by the multi-phase signal control method, the voltage converter, the voltage converter chip, the communications device, refer to beneficial effects achieved by the multi-phase signal control circuit provided above. Details are not described herein again.

DESCRIPTION OF EMBODIMENTS

In the present disclosure, "at least one" means one or more, and "a plurality of" means two or more. The term "and/or" describes an association relationship between associated objects and may indicate three relationships. For example, A and/or B may indicate the following cases: Only A exists; both A and B exist; and only B exists, where A and B may be singular or plural. "At least one of the following items (pieces)" or a similar expression thereof means any combination of these items, including any combination of singular items (pieces) or plural items (pieces). For example, at least one (piece) of a, b, or c may represent a, b, c, a-b, a-c, b-c, or a-b-c, where a, b, and c may be singular or plural. The character "/" usually represents an "or" relationship between the associated objects. In addition, in the embodiments of the present disclosure, terms such as "first" and "second" do not limit a quantity or an execution sequence.

It should be noted that, in the present disclosure, the term such as "example" or "for example" is used to represent giving an example, an illustration, or descriptions. Any embodiment or design described as an "example" or "for example" in the present disclosure should not be explained as having more advantages than another embodiment or design. Exactly, use of the word such as "example" or "for example" is intended to present a related concept in a specific manner.

Figure 3:
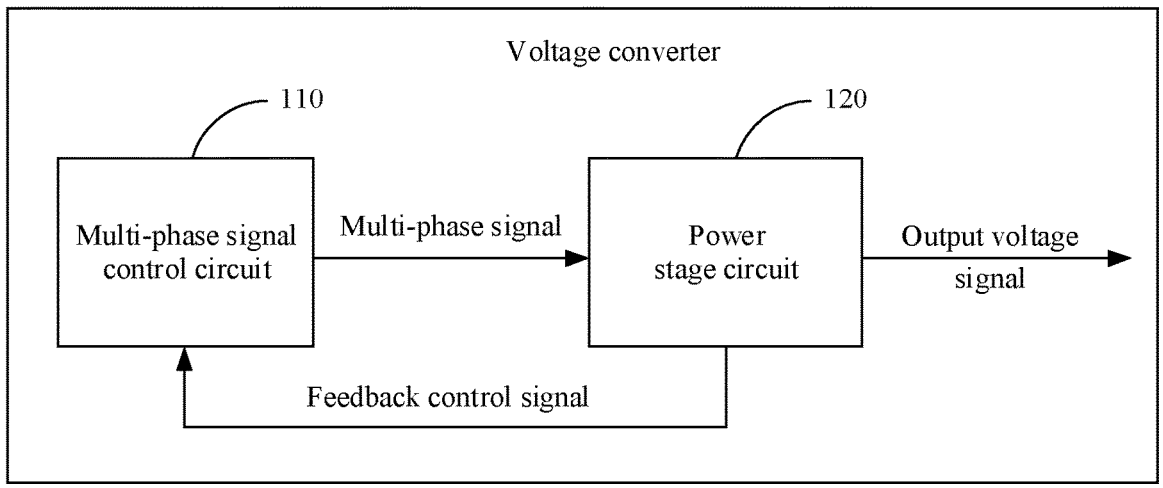
FIG. 3 is a schematic diagram of a structure of a voltage converter according to an embodiment of the present disclosure.

FIG. 3 is a schematic diagram of a structure of a voltage converter according to an embodiment of the present disclosure. Refer to FIG. 3. The voltage converter includes a multi-phase signal control circuit 110 and a power stage circuit 120. The multi-phase signal control circuit 110 is configured to: generate a pulse width modulation (PWM) signal based on a feedback control signal fed back by the power stage circuit 120, and generate a multi-phase signal that controls alternate charge and discharge based on the PWM signal. For example, the multi-phase signal may be a two-phase signal with different phases, a three-phase signal with different phases, or the like. The power stage circuit 120 is configured to generate a stable output voltage signal based on the multi-phase signal. It should be noted that for a specific process in which the power stage circuit 120 generates the stable output voltage signal based on the multi-phase signal, refer to related descriptions in FIG. 13 below. Details are not described again in this embodiment of the present disclosure.

Figure 1:
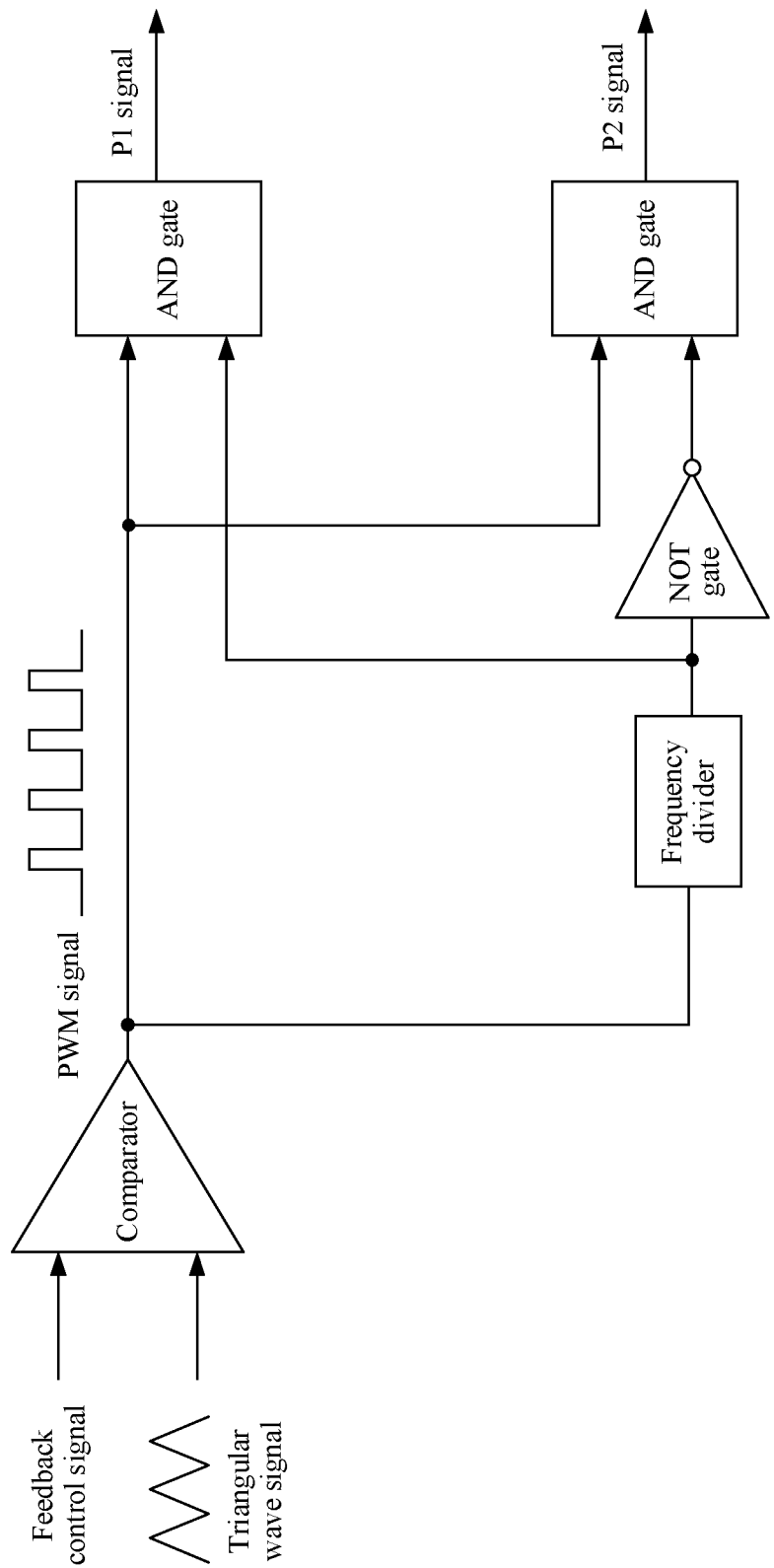
FIG. 1 is a schematic diagram of a structure of a multi-phase signal control circuit according to a conventional technology.
Figure 2:
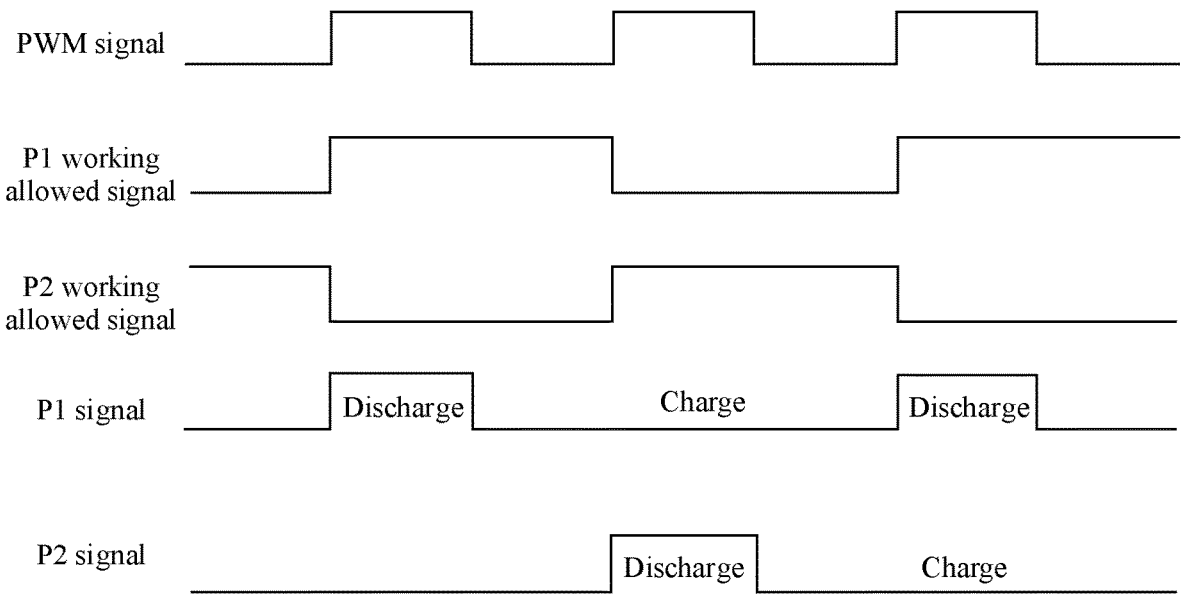
FIG. 2 is a signal timing diagram of generating a multi-phase signal according to a conventional technology.

Currently, in a switched capacitor (SC)—based voltage converter, frequency reduction processing is usually performed on a pulse width modulation (PWM) signal to generate a working allowed signal of each phase. Then, a logical operation is performed on the working allowed signal of each phase and the PWM signal to generate a multi-phase signal that operates alternately. For example, in the signal timing diagram shown in FIG. 2, a P1 signal and a P2 signal are generated by performing a logical AND operation on the PWM signal and a P1 working allowed signal and a P2 working allowed signal respectively. The P1 signal and the P2 signal ensure stability of an output of the voltage converter by controlling alternate charge and discharge. However, this method is only applicable when an on-off cycle controlled by the PWM signal is stable at a non-extreme frequency. When the on-off cycle controlled by the PWM signal is unstable and a frequency is excessively low or excessively high, the working allowed signal of each phase cannot be normally generated.

Figure 4:
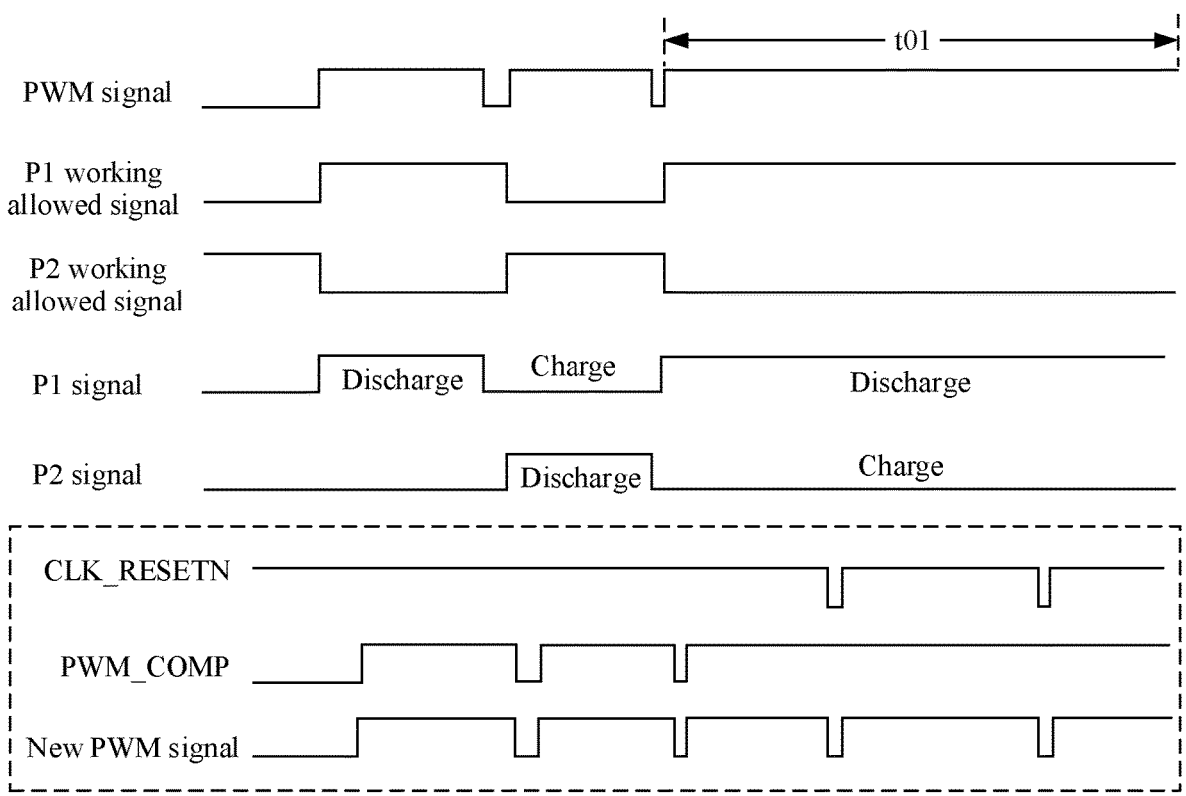
FIG. 4 is a signal timing diagram 1 of generating a multi-phase signal according to an embodiment of the present disclosure.

For example, as shown in FIG. 4, when the frequency of the PWM signal is excessively low, the voltage converter needs to discharge in a full cycle due to an insufficient output capability. Consequently, the PWM signal is in a second pass-through locked state within a t01 time period shown in FIG. 4 (that is, the PWM signal is in a high level state all the time, and phase switching cannot be implemented). In this case, the P1 working allowed signal and the P2 working allowed signal that are used for phase switching cannot be generated through frequency reduction, thereby causing an abnormal working state of the voltage converter. In this case, a logical operation may be performed on a clock reset CLK_RESET signal and a PWM signal (represented as a PWM_COMP signal in a dashed line box in FIG. 4) in a pass-through locked state that are shown in the dashed line box, to generate a new PWM signal. The new PWM signal is used to implement phase switching.

Figure 5:
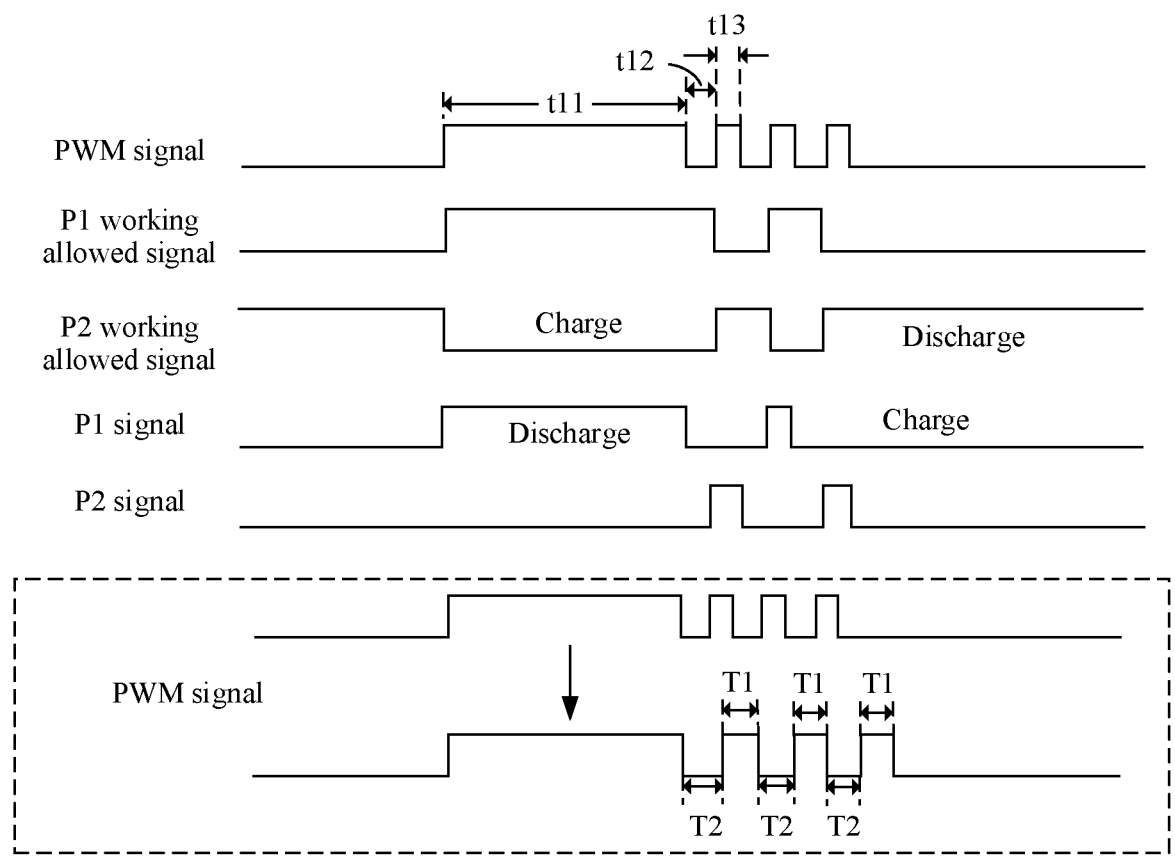
FIG. 5 is a signal timing diagram 2 of generating a multi-phase signal according to an embodiment of the present disclosure.

For example, as shown in FIG. 5, when the frequency of the PWM signal is excessively high, a long discharge period may be followed by a short charge time and then discharge. For example, a long discharge time in a t11 time period shown in FIG. 5 is followed by a short charge time in a t12 time period and discharge in a t3 time period (the P1 working allowed signal and the P2 working allowed signal discharge when being at a high level and charge when being at a low level). In this case, parasitic inductance of a power transistor in the power stage circuit suddenly changes to discharge in a high-current charging state. After a current direction abruptly changes, an extremely high glitch voltage on the power transistor in the power stage circuit is caused, thereby affecting reliability of the voltage converter, and further causing an abnormal working state of the voltage converter. In this case, as shown in the dashed box in FIG. 5, a minimum pulse width (represented as T1 in FIG. 5) corresponding to a high level and a minimum pulse width (represented as T2 in FIG. 5) corresponding to a low level in the PWM signal may be increased, to ensure reliability of the voltage converter. For example, the minimum pulse width corresponding to the high level is set to be equal to a minimum on-time minTon, and the minimum pulse width corresponding to the low level is set to be equal to a minimum off-time minToff. The minimum on-time and the minimum off-time are determined by a response time for the power stage circuit to control charging and discharging, and the minimum on-time and the minimum off-time are used to avoid a case in which the power stage circuit short-circuits between a power supply and a ground terminal.

However, in the manner shown in FIG. 4, if a frequency of the CLK_RESETN signal is excessively high, the PWM signal tends to be mistakenly triggered to invert a current level state, thereby affecting normal working of the voltage converter. If the frequency of the CLK_RESETN signal is excessively low, a frequency of switching between charging and discharging is reduced, thereby reducing a load capability of the voltage converter. In the manner shown in FIG. 5, an increase in the minimum pulse width corresponding to the high level in the PWM signal causes a maximum output duty ratio to decrease, and an increase in the minimum pulse width corresponding to the low level in the PWM signal causes a minimum output duty ratio to decrease. Consequently, the output voltage signal starts to skip a cycle earlier, thereby deteriorating the load capability of the voltage converter and increases amplitude of an output ripple.

Based on this, an embodiment of the present disclosure provides a multi-phase signal control circuit, and the multi-phase signal control circuit can still normally generate a working allowed signal of each phase when an on-off cycle controlled by a PWM signal is unstable. Further, a multi-phase signal that controls alternate charge and discharge is generated based on the PWM signal and the working allowed signal of each phase, so that a power stage circuit can generate a stable output voltage signal based on the multi-phase signal, and a loading capability of a voltage converter and stability of an output ripple can be ensured.

Figure 6:
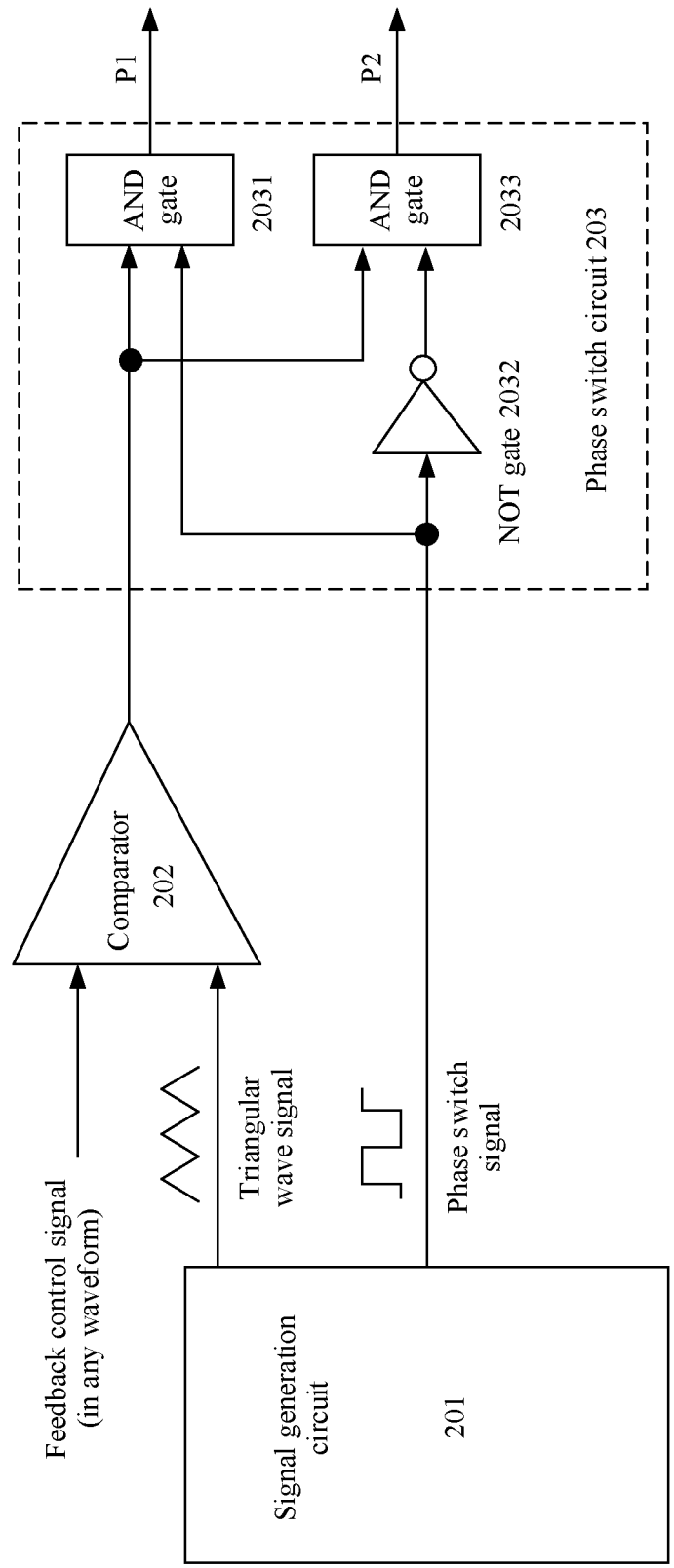
FIG. 6 is a schematic diagram 1 of a structure of a multi-phase signal control circuit according to an embodiment of the present disclosure.

FIG. 6 is a schematic diagram of a structure of a multi-phase signal control circuit according to an embodiment of the present disclosure. The multi-phase signal control circuit includes a signal generation circuit 201, a comparator 202, and a phase switch circuit 203.

Figure 7:
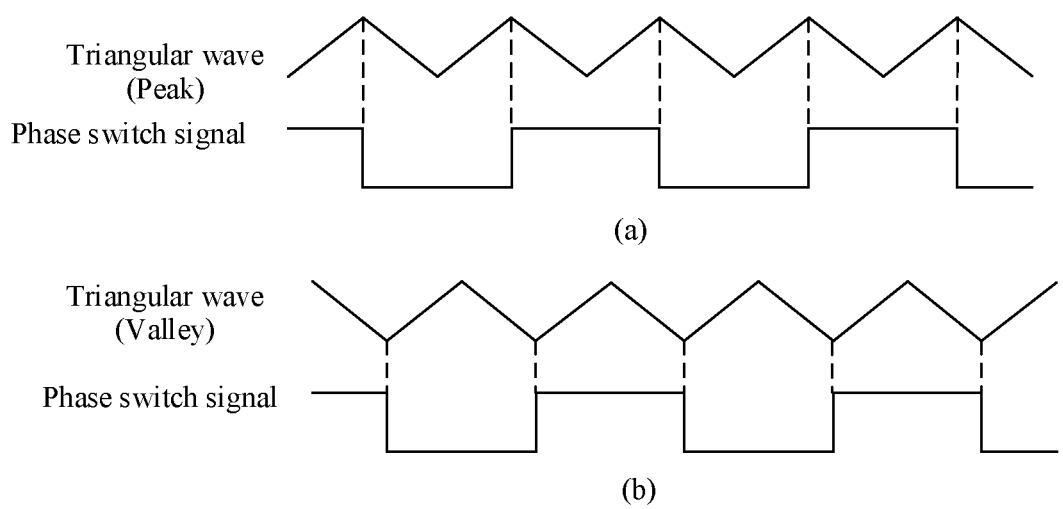
FIG. 7 is a timing diagram of a phase switch signal according to an embodiment of the present disclosure.
Figure 8:
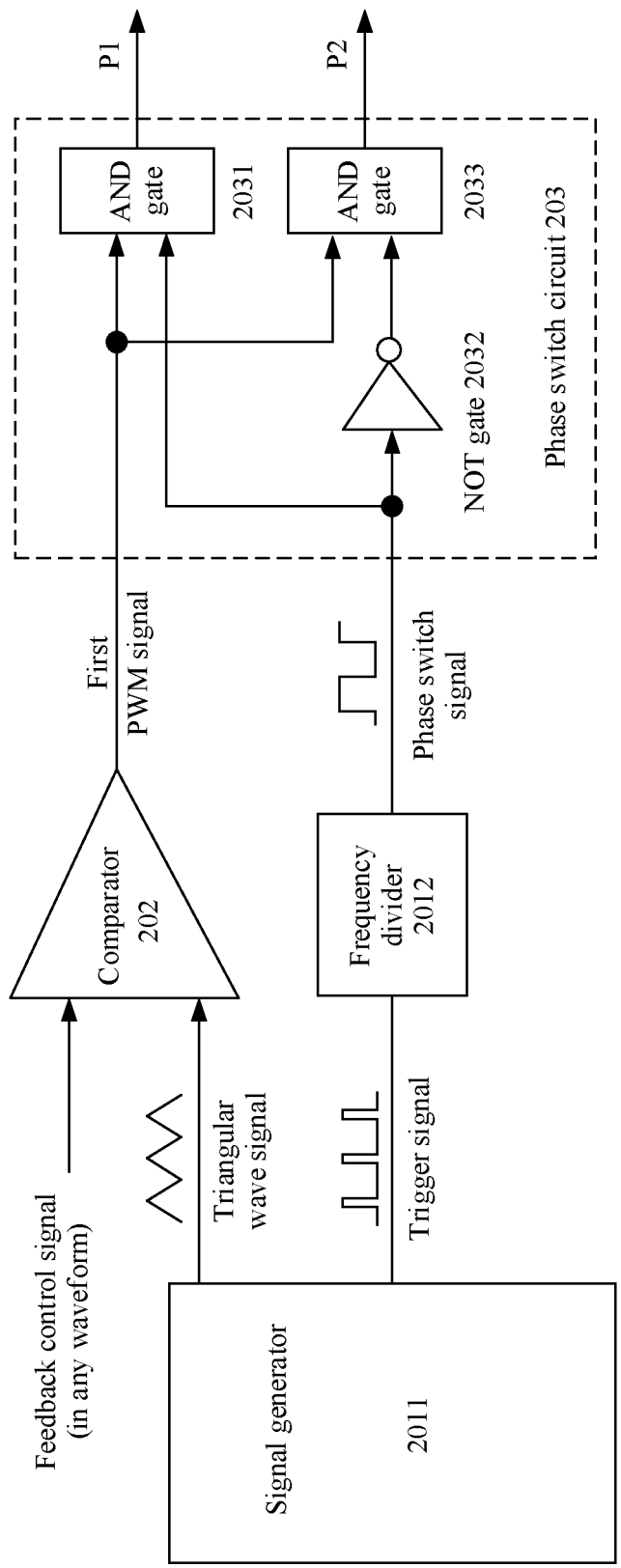
FIG. 8 is a schematic diagram 2 of a structure of a multi-phase signal control circuit according to an embodiment of the present disclosure.

In this embodiment of the present disclosure, the signal generation circuit 201 is configured to generate a triangular wave signal and a phase switch signal, where a frequency of the phase switch signal may be N times a frequency of the triangular wave signal, and N is an integer greater than or equal to 1. The signal generation circuit 201 may be configured to generate a clock signal, and generate the triangular wave signal and the phase switch signal based on the clock signal, where the phase switch signal may be a signal generated close to a peak or a valley of the triangular wave signal. The phase switch signal may be a pulse signal, a square wave signal, a sawtooth signal, or any specific signal. For example, in an example in which the phase switch signal is a square wave signal, a phase switch signal shown in (a) in FIG. 7 is a signal generated close to a peak of the triangular wave signal. A phase switch signal shown in (b) in FIG. 7 is a signal generated close to a valley of the triangular wave signal. Optionally, as shown in FIG. 8, the signal generation circuit 201 includes a signal generator 2011 and a frequency divider 2012. The signal generator 2011 is configured to generate the triangular wave signal and a trigger signal having a same frequency as the triangular wave signal (the trigger signal may be a pulse signal, a square wave signal, a sawtooth signal, or any specific signal), where a position of a transition edge of the trigger signal may be the same as a position of a peak or a valley of the triangular wave signal. The frequency divider 2012 is configured to perform frequency division processing on the trigger signal to obtain the phase switch signal. It should be noted that the signal generation circuit 201 may include only the signal generator 2011. In this case, the phase switch signal is the trigger signal, and a frequency of the phase switch signal is the same as the frequency of the triangular wave signal. When the signal generation circuit 201 includes both the signal generator 2011 and the frequency divider 2012, the frequency of the phase switch signal is an integer multiple of the frequency of the triangular wave signal. In addition, the frequency of the triangular wave signal generated by the signal generator 2011 may be stable.

The comparator 202 is configured to compare the triangular wave signal with a feedback control signal to output a first pulse width modulation PWM signal, where the feedback control signal is a signal fed back by a power stage circuit. The feedback control signal may be a signal of any waveform, and the feedback control signal may be a signal generated by the power stage circuit based on an error between an actual output voltage and a preset output voltage. In other words, the feedback control signal is related to an error between an output voltage signal and a preset voltage signal. In addition, the comparator 202 may be configured to: receive the triangular wave signal generated by the signal generation circuit 201 and the feedback control signal output by the power stage circuit, and compare the triangular wave signal with the feedback control signal to output the first PWM signal. For example, the comparator 202 may output a high level when the feedback control signal is greater than the triangular wave signal, and output a low level when the feedback control signal is less than the triangular wave signal, to obtain the first PWM signal.

The phase switch circuit 203 is configured to perform phase switching processing on the first PWM signal using the phase switch signal, to obtain a first phase signal and a second phase signal, where the first phase signal and the second phase signal are used to control the power stage circuit to generate the output voltage signal. Optionally, the phase switch circuit 203 may segment a high-level pulse width of the first PWM signal into at least one of the first phase signal or the second phase signal using the phase switch signal (for example, segment a first high-level pulse width of the first PWM signal into the first phase signal, segment a second high-level pulse width into the second phase signal, and segment a part of a third high-level pulse width into the first phase signal and the other part into the second phase signal). Alternatively, the phase switch circuit 203 may segment a low-level pulse width of the first PWM signal using the phase switch signal, and separately process two signals obtained through segmentation using a phase inverter, to obtain the first phase signal and the second phase signal. A result of logical OR processing performed on the first phase signal and the second phase signal may be the first PWM signal.

In a possible implementation, the phase switch circuit 203 may include a first AND gate 2031, a NOT gate 2032, and a second AND gate 2033. The first AND gate 2031 is configured to perform a logical AND operation (that is, perform AND gate processing) on the phase switch signal and the first PWM signal to obtain a first phase signal P1. The NOT gate 2032 is configured to perform a logical NOT operation (that is, perform NOT gate processing) on the phase switch signal. The second AND gate 2033 is configured to perform a logical AND operation (that is, perform AND gate processing) on a signal obtained after the logical NOT operation and the first PWM signal, to obtain a second phase signal P2.

Figure 9:
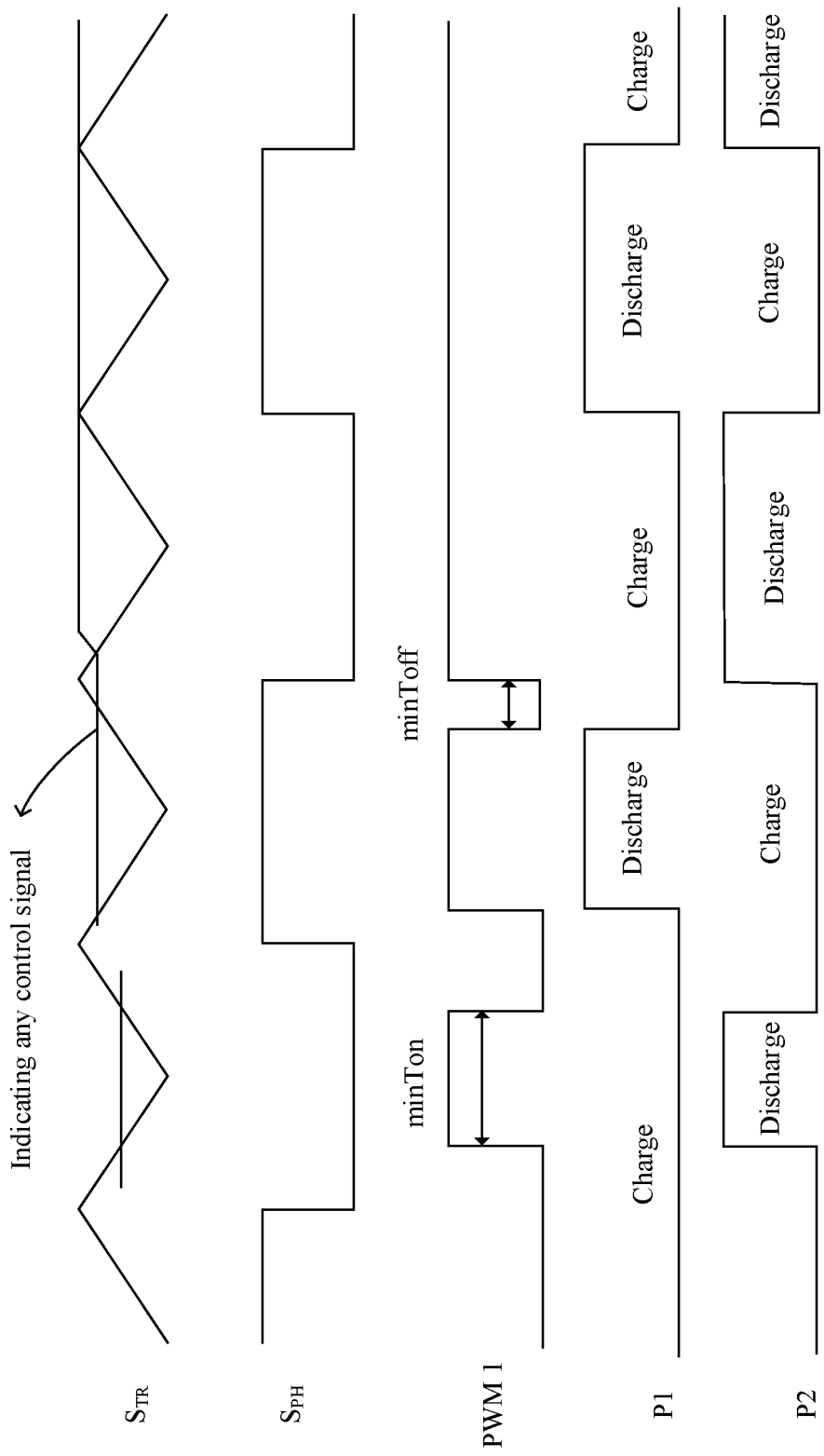
FIG. 9 is a signal timing diagram 3 of generating a multi-phase signal according to an embodiment of the present disclosure.

For example, timing of signals generated in the multi-phase signal control circuit may be shown in FIG. 9. $S_{TR}$ represents the triangular wave signal, $S_{PH}$ represents the phase switch signal, a PWM 1 signal represents the first PWM signal output by the comparator 202, P1 represents the first phase signal output by the phase switch circuit 203, and P2 represents the second phase signal output by the phase switch circuit 203.

In the timing diagram shown in FIG. 9, neither a minimum pulse width corresponding to a high level nor a minimum pulse width corresponding to a low level in the first PWM signal coincides with an edge of the phase switch signal $S_{PH}$. To be specific, charge/discharge times of the P1 signal and the P2 signal generated by performing phase switching processing on the first PWM signal using the phase switch signal $S_{PH}$ are not less than a minimum pulse width corresponding to the high level or a minimum pulse width corresponding to the low level in the first PWM signal. For example, in FIG. 9, minTon represents the minimum pulse width corresponding to the high level in the first PWM signal, and minToff represents the minimum pulse width corresponding to the low level in the first PWM signal. The discharge times of the P1 signal and the P2 signal are greater than or equal to minTon, and the charge times of the P1 signal and the P2 signal are greater than or equal to minToff. In this way, the power stage circuit can generate the output voltage signal based on the P1 signal and the P2 signal. In addition, a loading capability of a voltage converter and stability of an output ripple can be ensured.

Figure 10:
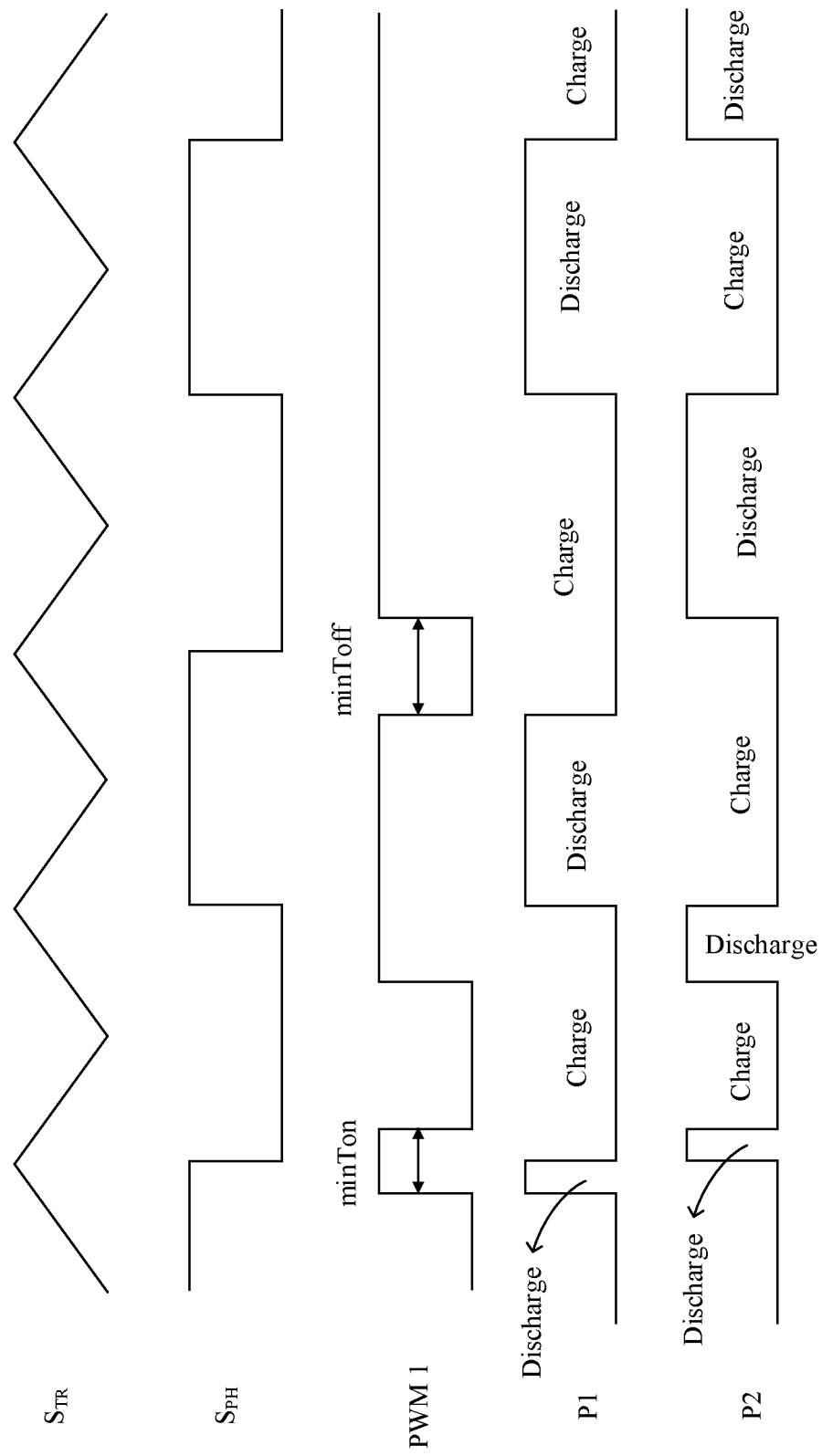
FIG. 10 is a signal timing diagram 4 of generating a multi-phase signal according to an embodiment of the present disclosure.

As shown in FIG. 10, it is assumed that the minimum pulse width (represented as minTon in FIG. 10) corresponding to the high level or the minimum pulse width (represented as minToff in FIG. 10) corresponding to the low level in the first PWM signal coincides with the edge of the phase switch signal. In other words, the charge/discharge times of the P1 signal and the P2 signal generated by performing phase switching processing on the first PWM signal using the phase switch signal $S_{PH}$ are less than the minimum pulse width corresponding to the high level or the minimum pulse width corresponding to the low level in the first PWM signal. In this case, the multi-phase signal control circuit may generate the multi-phase signal in the following manner.

Figure 11:
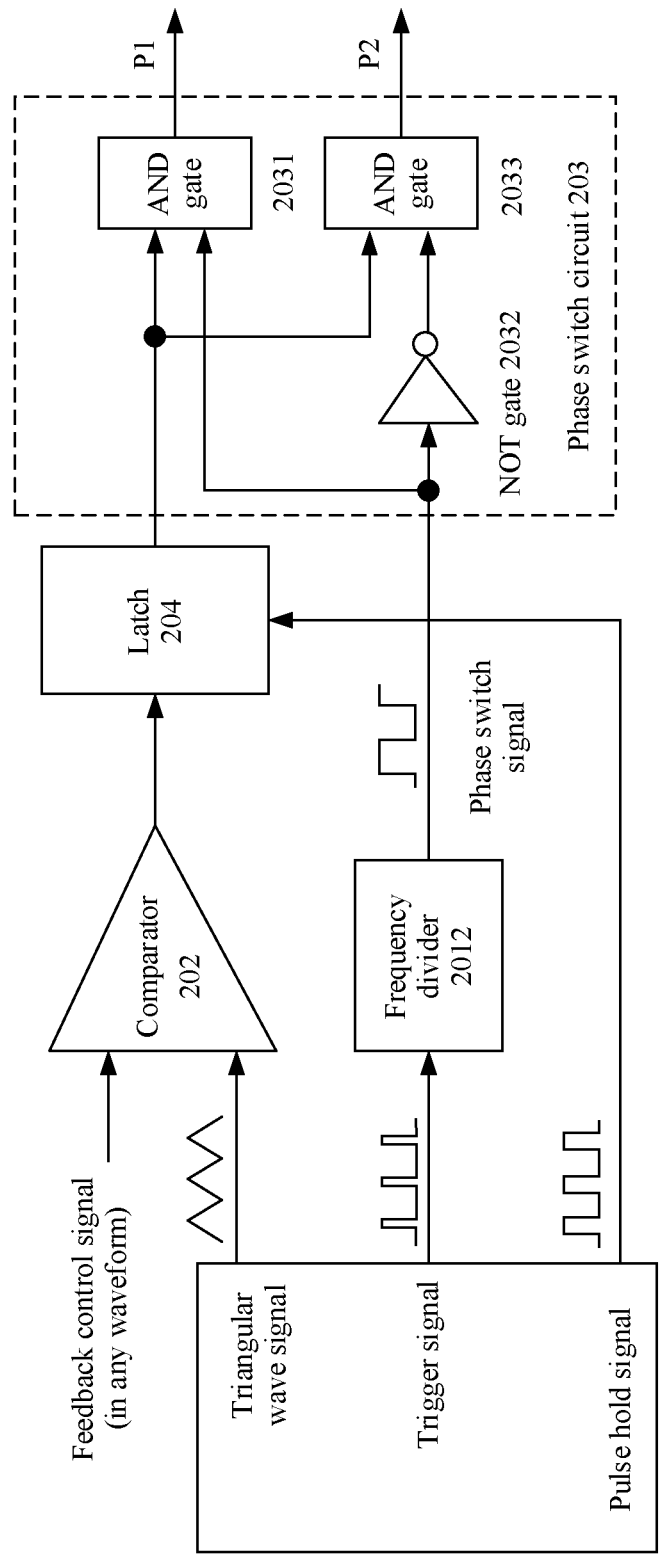
FIG. 11 is a schematic diagram 3 of a structure of a multi-phase signal control circuit according to an embodiment of the present disclosure.

As shown in FIG. 11, the multi-phase signal control circuit may further include a latch 204, where the latch 204 is configured to latch the first PWM signal to output a second PWM signal. The signal generator 2011 is further configured to generate a pulse hold signal, where a position of a high-level pulse width of the pulse hold signal corresponds to a position of a high-level pulse width of the trigger signal (that is, high-level duration of the pulse hold signal is greater than or equal to high-level duration of the trigger signal in a same time period). A clock for generating the pulse hold signal may have a same clock source as a clock for generating the triangular wave signal and the phase switch signal. Correspondingly, the first PWM signal output by the comparator 202 may also be referred to as a PWM_CMP signal, and the latch 204 is configured to latch the first PWM signal based on the pulse hold signal, to output the second PWM signal. For example, the latch 204 may be configured to: when the first PWM signal coincides with a rising edge of the pulse hold signal, maintain a current state of the first PWM signal for a time period, where the time period is equal to a time period corresponding to the high-level pulse width of the pulse hold signal. Then, the phase switch circuit 203 may be configured to perform phase switching processing on the second PWM signal using the phase switch signal, to output the first phase signal and the second phase signal. In this case, a result of logical OR processing performed on the first phase signal and the second phase signal may be the second PWM signal.

Optionally, the high-level pulse width of the pulse hold signal may be equal to twice a minimum on-time (namely, 2*minTon), twice a minimum off-time (namely, 2*minToff), or twice a larger value between a minimum on-time and a minimum off-time (namely, 2*max(minTon, minToff)). In a possible implementation, when the phase switch signal is a signal generated close to the valley of the triangular wave signal, the high-level pulse width of the pulse hold signal may be equal to twice the minimum off-time; and when the phase switch signal is a signal generated close to the peak of the triangular wave signal, the high-level pulse width of the pulse hold signal may be equal to twice the minimum on-time.

Figure 12:
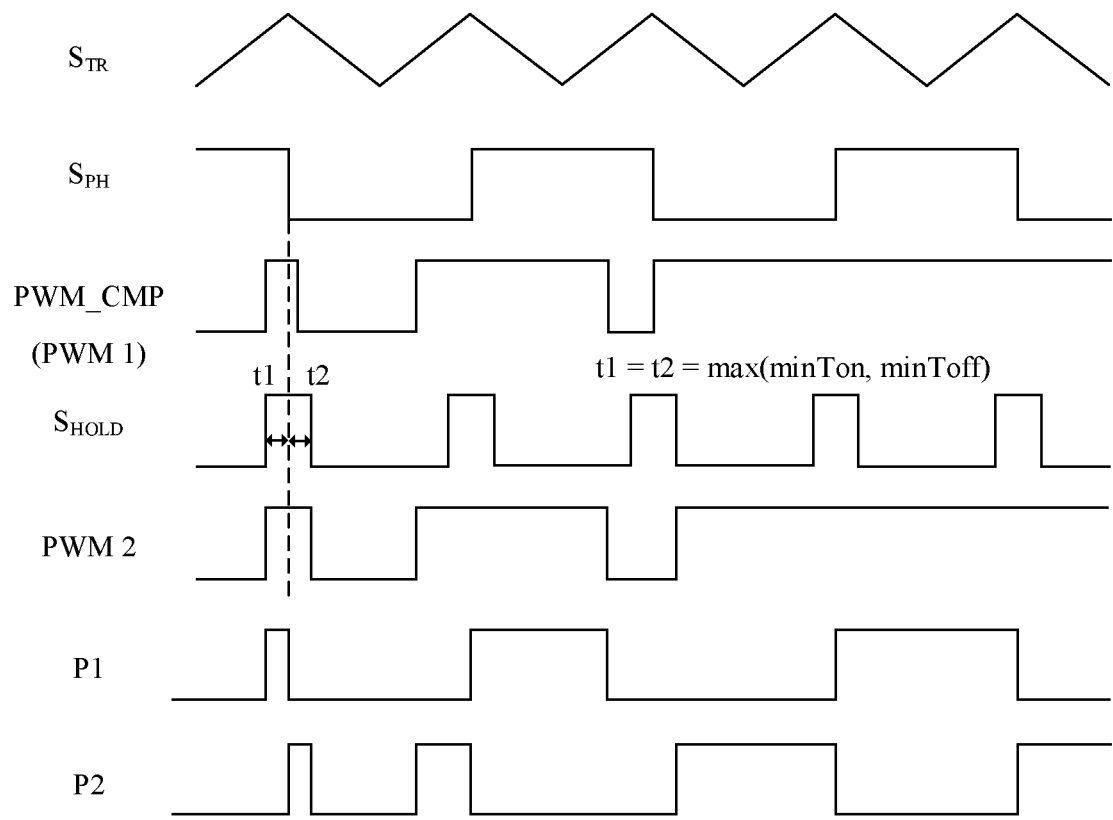
FIG. 12 is a signal timing diagram 5 of generating a multi-phase signal according to an embodiment of the present disclosure.

For example, in this case, timing of signals generated in the multi-phase signal control circuit may be shown in FIG. 12. $S_{TR}$ represents the triangular wave signal generated by the signal generation circuit 201, $S_{PH}$ represents the phase switch signal generated by the signal generation circuit 201, $S_{HOLD}$ represents the pulse hold signal generated by the signal generation circuit 201, 2*max(minTon, minToff) represents the high-level pulse width of $S_{HOLD}$, PWM_CMP represents the first PWM signal output by the comparator 202, a PWM 2 signal represents the second PWM signal output by the latch 204, P1 represents the first phase signal output by the phase switch circuit 203, and P2 represents the second phase signal output by the phase switch circuit 203.

As can be seen from FIG. 12, latching processing is performed on the PWM 1 signal (namely, the PWM_CMP signal) using the pulse hold signal $S_{HOLD}$, so that a minimum pulse width corresponding to a high level or a minimum pulse width corresponding to a low level in the output PWM 2 signal can be greater than or equal to the high-level pulse width of the pulse hold signal $S_{HOLD}$. In this way, when phase switching processing is performed on the PWM 2 signal using the phase switch signal $S_{PH}$, charge/discharge times of the generated P1 signal and the P2 signal can meet requirements of the minimum on-time and minimum off-time of the power stage circuit. Therefore, the power stage circuit can generate a stable output voltage signal based on the P1 signal and the P2 signal, and can ensure the loading capability of the voltage converter and stability of an output ripple.

Further, the signal generator 2011 in the multi-phase signal control circuit may have the following two different structures, which are described below.

Figure 13:
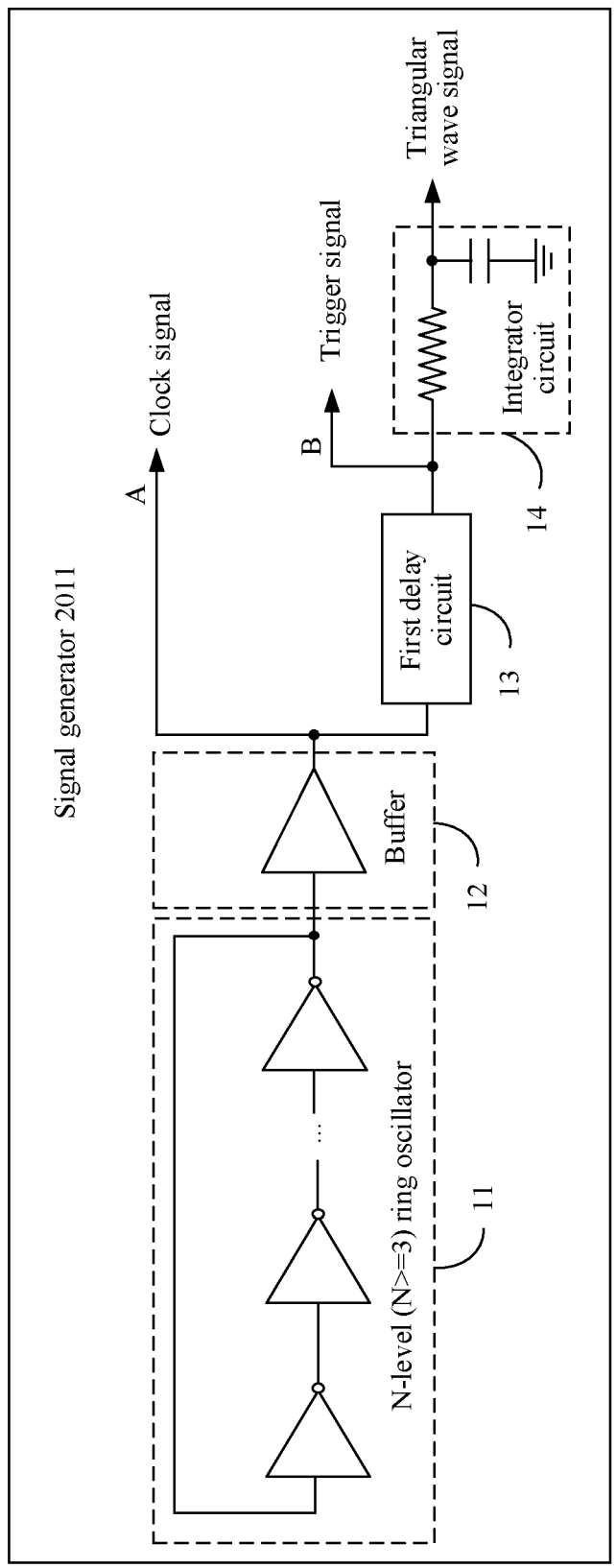
FIG. 13 is a schematic diagram 1 of a structure of a signal generator according to an embodiment of the present disclosure.

A first structure is shown in FIG. 13. The signal generator 2011 may include a ring oscillator 11, a buffer 12, a first delay circuit 13, and an integrator circuit 14. The ring oscillator 11 is configured to output an oscillation signal. The ring oscillator 11 may be an N-level ring oscillator including N NOT gates, an output of one of the N NOT gates is connected to an input of a next NOT gate in sequence, and N is an integer greater than or equal to 3. The buffer 12 is configured to receive an oscillation signal generated by the ring oscillator, and buffer the oscillation signal to output a clock signal. The buffering the oscillation signal herein may mean shaping a waveform of the oscillation signal. The first delay circuit 13 is configured to receive the clock signal, and delay the clock signal by a first phase to output the trigger signal. The integrator circuit 14 is configured to perform integration processing on the trigger signal to generate the triangular wave signal.

Figure 13A:
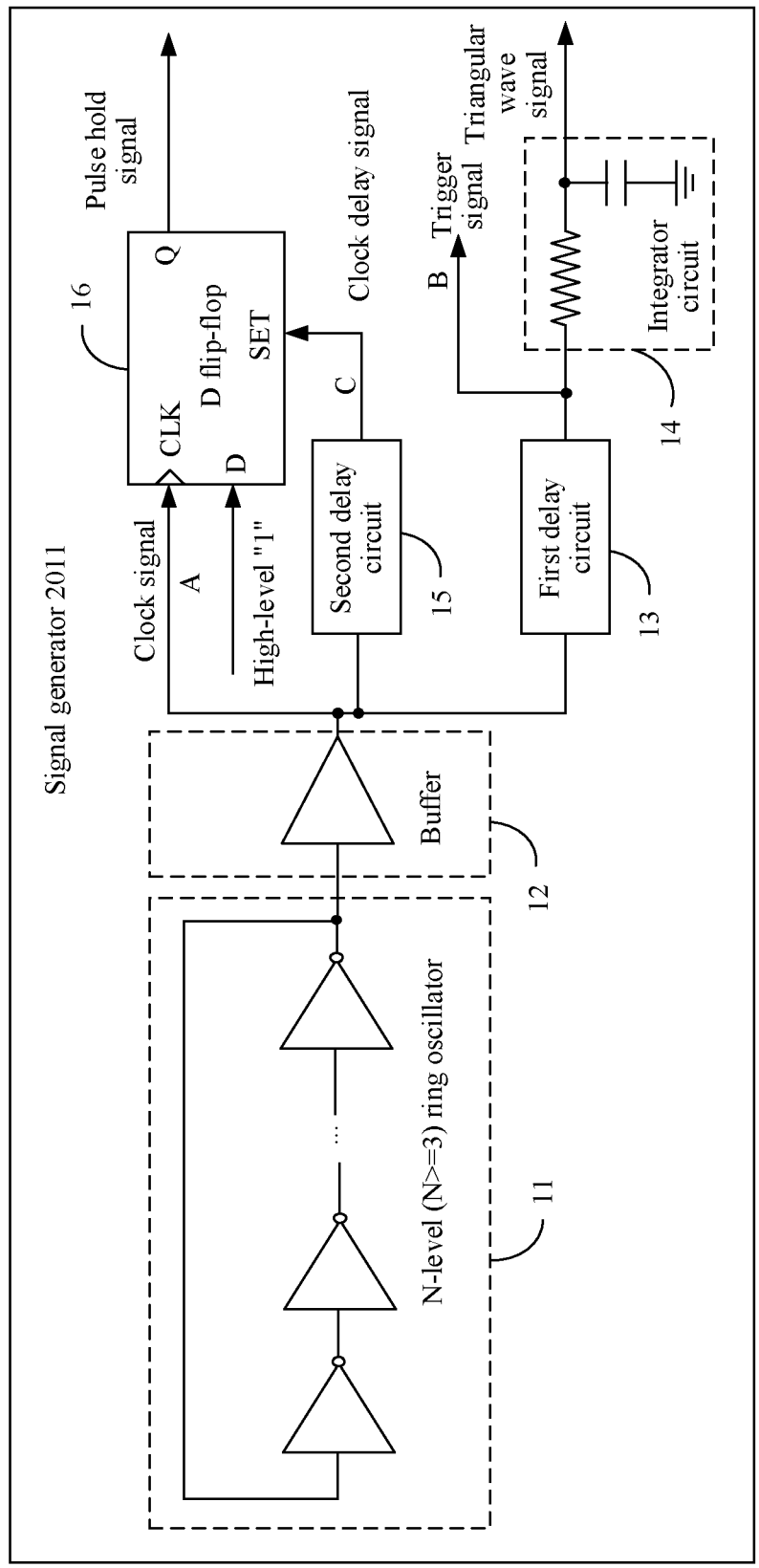
FIG. 13A is a schematic diagram 2 of a structure of a signal generator according to an embodiment of the present disclosure.

Further, refer to FIG. 13A. The signal generator 2011 may further include a second delay circuit 15 and a D flip-flop 16. The second delay circuit 15 is configured to delay the clock signal output by the buffer 12 by a second phase to output a clock delay signal, where the second phase is equal to twice the first phase. The D flip-flop 16 is configured to: receive, through a clock input (CLK), the clock signal output by the buffer 12; receive, through a set input (RESET), the clock delay signal output by the second delay circuit 15; and generate a pulse hold signal based on the clock signal and the clock delay signal. The pulse hold signal is output by a Q output of the D flip-flop 16, and a D input of the D flip-flop 16 is set to "1", indicating a high level.

Figure 13B:
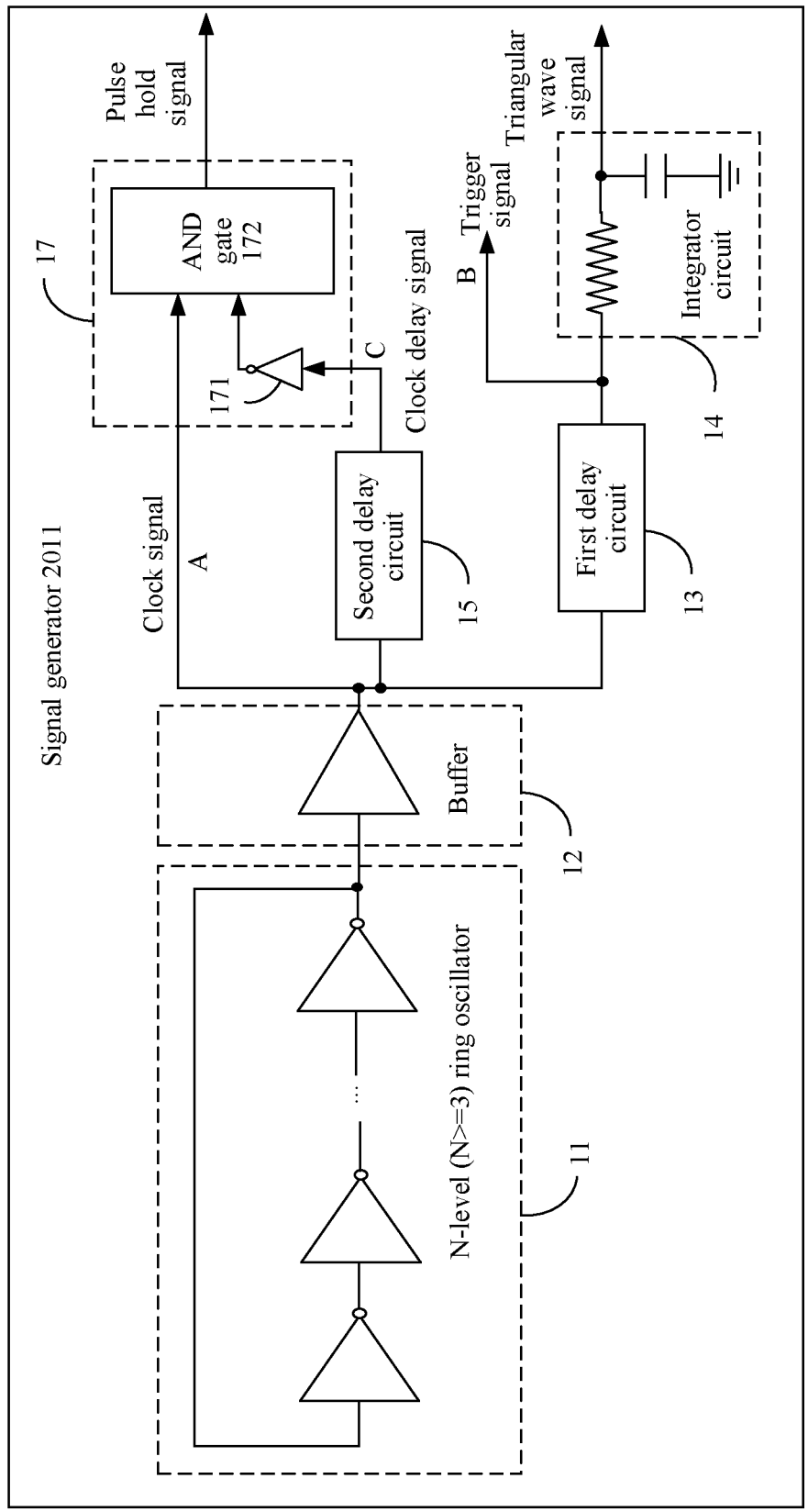
FIG. 13B is a schematic diagram 3 of a structure of a signal generator according to an embodiment of the present disclosure.

Alternatively, refer to FIG. 13B. The signal generator 2011 may further include a second delay circuit 15 and a logical operation circuit 17, where the logical operation circuit 17 includes a NOT gate 171 and an AND gate 172. The second delay circuit 15 is configured to delay the clock signal output by the buffer 12 by a second phase to output a clock delay signal, where the second phase is equal to twice the first phase. The logical operation circuit 17 is configured to: perform, through the NOT gate 171, a logical NOT operation on the clock delay signal output by the second delay circuit 15; and perform, through the AND gate 172, a logical AND operation on a signal obtained after the logical NOT operation and the clock signal output by the buffer 12, to generate a pulse hold signal.

It should be noted that A in FIG. 13, FIG. 13A, and FIG. 13B may represent the clock signal output by the buffer 12, B may represent the trigger signal output by the first delay circuit 13, and C may represent the clock delay signal output by the second delay circuit 15.

Figure 14:
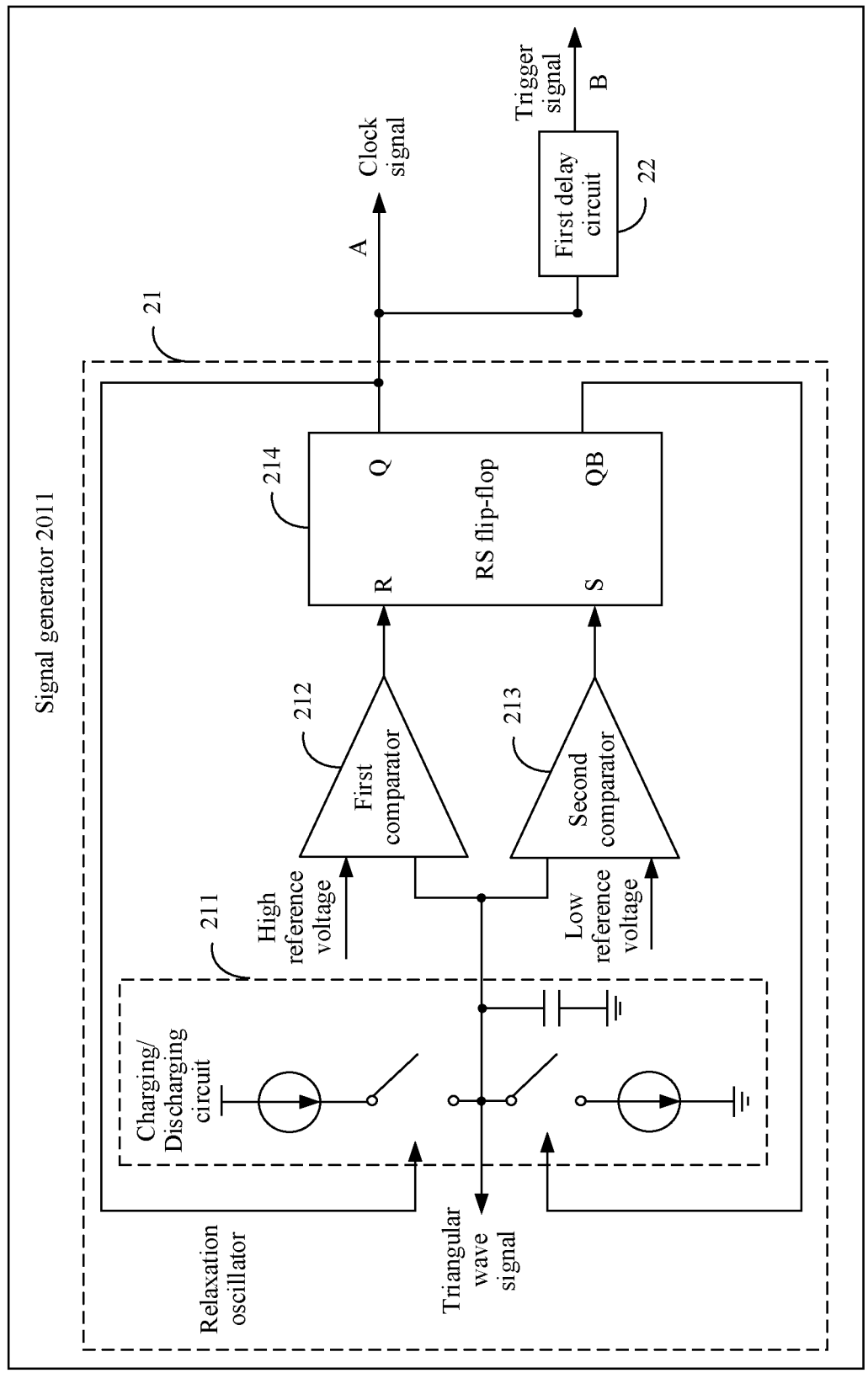
FIG. 14 is a schematic diagram 4 of a structure of a signal generator according to an embodiment of the present disclosure.

A second structure is shown in FIG. 14. The signal generator 2011 may include a relaxation oscillator 21 and a first delay circuit 22. The relaxation oscillator 21 is configured to generate a clock signal, and generate the triangular wave signal based on the clock signal. The first delay circuit 22 is configured to receive the clock signal output by the relaxation oscillator 21, and delay the clock signal by a first phase to output the trigger signal. Specifically, the relaxation oscillator 21 may include a charging/discharging circuit 211, a first comparator 212, a second comparator 213, and an RS flip-flop 214. A Q output of the RS flip-flop 214 is configured to control a switch of a power supply of the charging/discharging circuit 211 (when the Q output is at a high level, the switch at the power supply is closed, and the power supply charges a capacitor through a charge current). A QB output of the RS flip-flop 214 is configured to control a switch of a ground terminal of the charging/discharging circuit (when the QB output is at a low level, the switch of the ground terminal is closed, and the ground terminal discharges the capacitor through a discharge current.) An output of the charging/discharging circuit 211 is connected to both an input of the first comparator 212 and an input of the second comparator 213, the other input of the first comparator 212 is configured to receive a high reference voltage, and the other input of the second comparator 213 is configured to receive a low reference voltage. An output of the first comparator 212 is connected to an input R of the RS flip-flop 214 (the first comparator 212 controls the input R to be at a high level or a low level by comparing the high reference voltage with an output voltage of the charging/discharging circuit 211). An output of the second comparator 213 is connected to an input S of the RS flip-flop 214 (the second comparator 213 controls the input S to be at a high level or a low level by comparing the low reference voltage with an output voltage of the charging/discharging circuit 211).

Figure 14A:
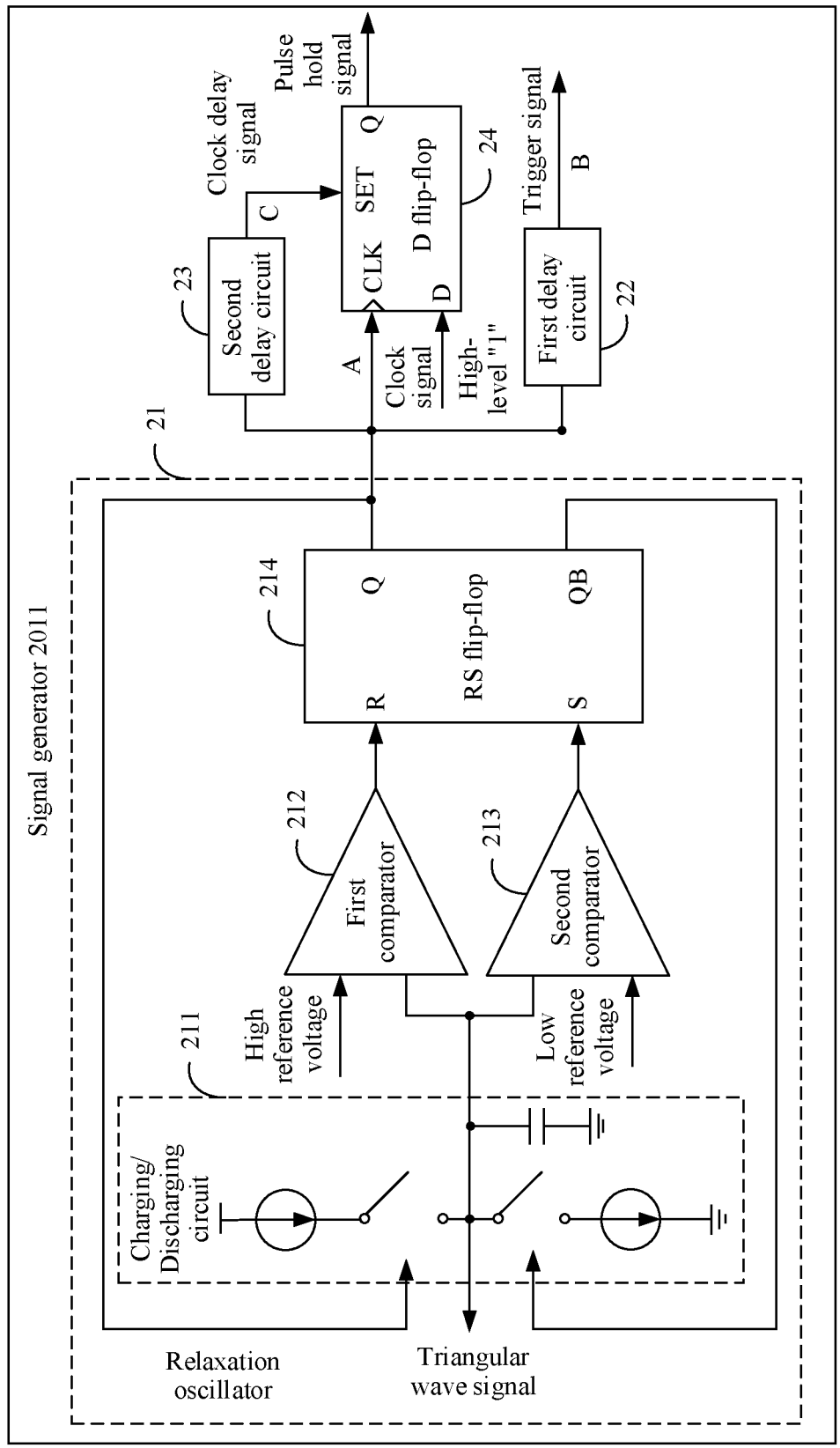
FIG. 14A is a schematic diagram 5 of a structure of a signal generator according to an embodiment of the present disclosure.

Further, refer to FIG. 14A. The signal generator 2011 may further include a second delay circuit 23 and a D flip-flop 24. The second delay circuit 23 is configured to delay the clock signal output by the relaxation oscillator 21 by a second phase to output a clock delay signal, where the second phase is equal to twice the first phase. The D flip-flop 24 is configured to: receive, through a clock input (CLK), the clock signal output by the relaxation oscillator 21; receive, through a set input (RESET), the clock delay signal output by the second delay circuit 23; and generate a pulse hold signal based on the clock signal and the clock delay signal. The pulse hold signal is output by a Q output of the D flip-flop 24, and a D input of the D flip-flop 24 is set to "1", indicating a high level.

Figure 14B:
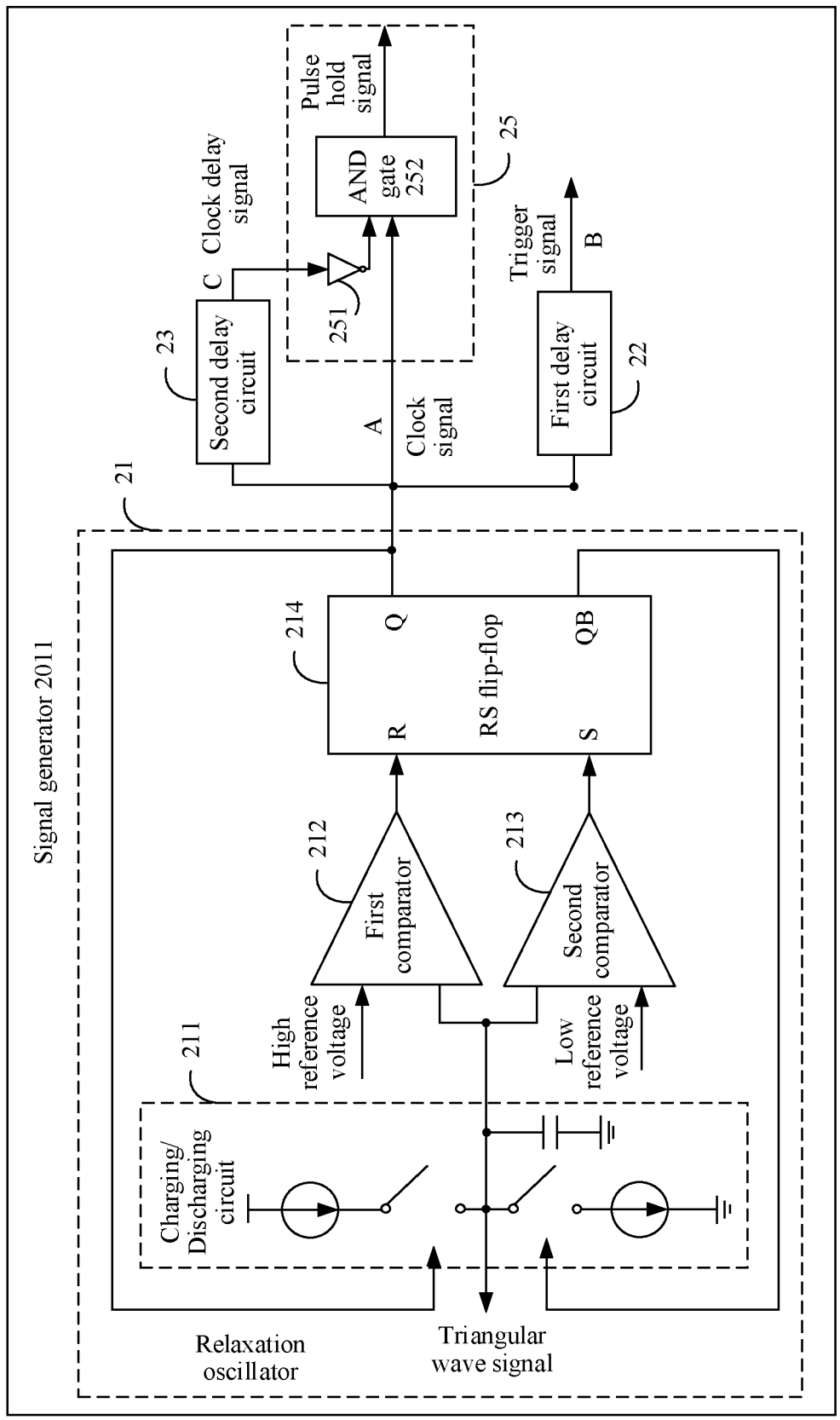
FIG. 14B is a schematic diagram 6 of a structure of a signal generator according to an embodiment of the present disclosure.

Alternatively, refer to FIG. 14B. The signal generator 2011 may further include a second delay circuit 23 and a logical operation circuit 25, where the logical operation circuit 25 includes an NOT gate 251 and an AND gate 252. The second delay circuit 23 is configured to delay the clock signal output by the relaxation oscillator 21 by a second phase to output a clock delay signal, where the second phase is equal to twice the first phase. The logical operation circuit 25 is configured to: perform, through the NOT gate 251, a logical NOT operation on the clock delay signal output by the second delay circuit 23; and perform, through the AND gate 252, a logical AND operation on a signal obtained after the logical NOT operation and the clock signal output by the relaxation oscillator 21, to generate a pulse hold signal.

It should be noted that, in FIG. 14, FIG. 14A, and FIG. 14B, A may represent the clock signal output by the relaxation oscillator 21, B may represent the trigger signal output by the first delay circuit 22, and C may represent the clock delay signal output by the second delay circuit 23.

Figure 15:
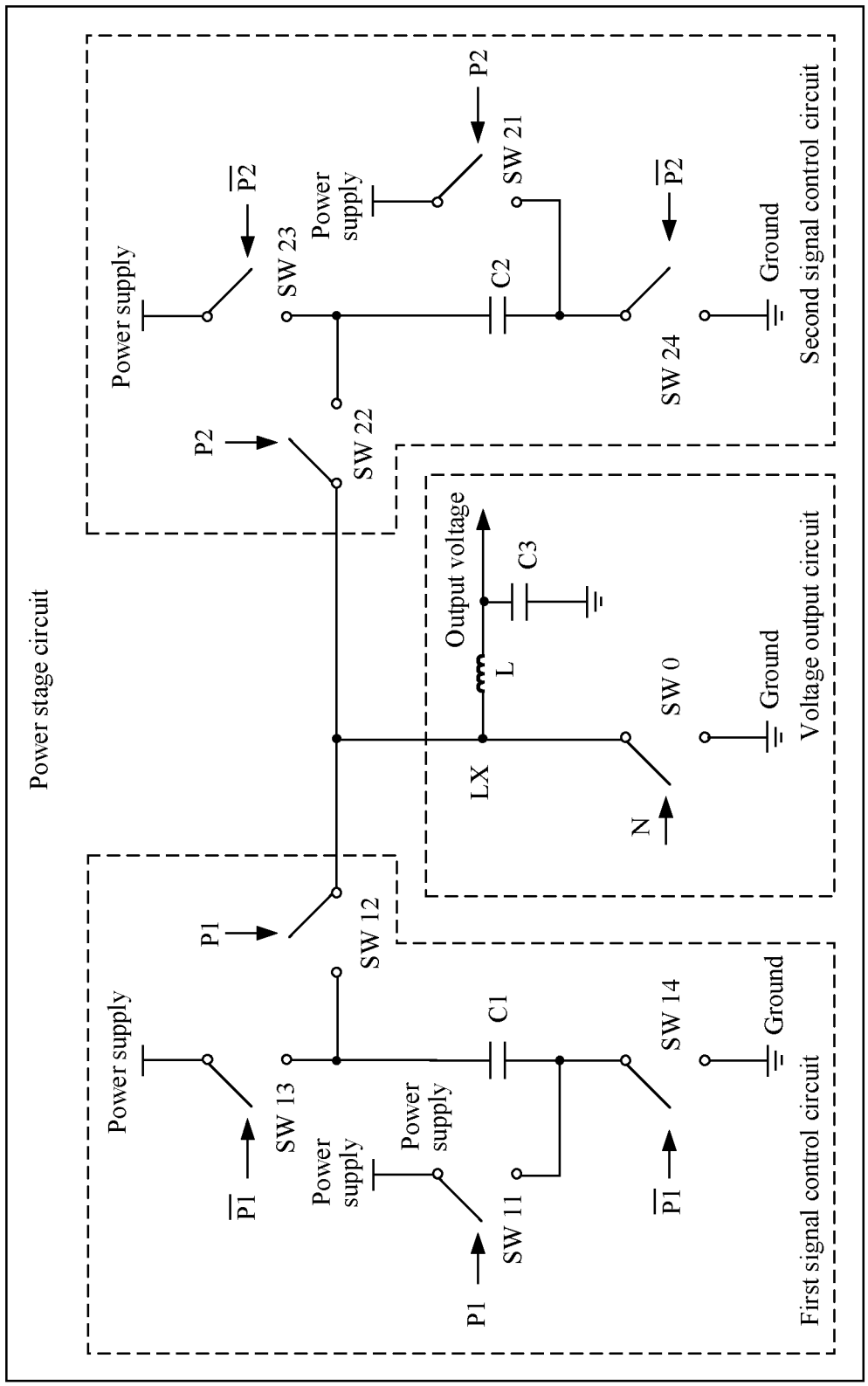
FIG. 15 is a schematic diagram of a structure of a power stage circuit according to an embodiment of the present disclosure.

Further, FIG. 15 is a schematic diagram of a structure of a power stage circuit according to an embodiment of the present disclosure. Refer to FIG. 15. The power stage circuit includes a first signal control circuit, a second signal control circuit, and a voltage output circuit located between the first signal control signal and the second signal control circuit.

The first signal control circuit may include a first capacitor C1, two switches (shown as SW 11 and SW 12 in FIG. 15) controlled by a first phase signal P1, and two switches (shown as SW 13 and SW 14 in FIG. 15) controlled by an inverted signal $\overline{P1}$ of the first phase signal. The first signal control circuit is provided with a plurality of switches (namely, SW 11 to SW 14) that can be used to receive the first phase signal P1 and control the first signal control circuit based on the first phase signal P1 and the inverted signal $\overline{P1}$ of the first phase signal.

Similarly, the second signal control circuit may include a second capacitor C2, two switches (shown as SW 21 and SW 22 in FIG. 15) controlled by the second phase signal P2, and two switches (shown as SW 23 and SW 24 in FIG. 15) controlled by an inverted signal $\overline{P2}$ of the second phase signal. The second signal control circuit is provided with a plurality of switches (namely, SW 21 to SW 24) that can be used to receive the second phase signal P2 and control the second signal control circuit based on the second phase signal P2 and the inverted signal $\overline{P2}$ of the second phase signal.

The voltage output circuit may include an inductor L, a third capacitor C3, a switch (shown as SW 0 in FIG. 15) controlled by an N signal, where the N signal is an inverted signal of a PWM signal. One terminal of the inductor L and one terminal of the switch SW 0 are connected to a coupling terminal LX of the first control circuit and the second control circuit, the other terminal of the switch SW 0 is coupled to a ground terminal, the other terminal of the inductor L is coupled to one terminal of the third capacitor C3 as a voltage output, and the other terminal of the third capacitor C3 is coupled to the ground terminal.

Specifically, in the first signal control circuit, when the first phase signal P1 is at a low level and the inverted signal $\overline{P1}$ of the first phase signal is at a high level, both SW 11 and SW 12 are open, both SW 13 and SW 14 are closed, and two terminals of the first capacitor C1 are connected to a power supply and a ground (GND), so that the power supply charges the first capacitor C1. When the first phase signal P1 is at a high level and the inverted signal $\overline{P1}$ of the first phase signal is at a low level, both SW 11 and SW 12 are closed, both SW 13 and SW 14 are open, and two terminals of the first capacitor C1 are connected to the power supply and an LX terminal of the inductor L. In this case, according to the law of capacitor charge conservation, after a lower plate of the first capacitor C1 is connected to the power supply, a voltage of the LX terminal connected to an upper plate of the first capacitor C1 is twice a voltage of the power supply. A working principle of the second signal control circuit is similar to a working principle of the first signal control circuit. Details are not described again in this embodiment of the present disclosure.

Because the first phase signal P1 and the second phase signal P2 are obtained through phase switching of the PWM signal, when the PWM signal is at a high level, either the first phase signal P1 or the second phase signal P2 is at a high level. Therefore, the first phase signal P1 and the second phase signal P2 can ensure that the voltage of the LX terminal is always twice the voltage of the power supply through logical alternate operation. When the PWM signal is at a low level, the inverted signal N of the PWM signal is at a high level. In this case, the LX terminal and the inductor L are in a discharge state.

Based on the foregoing description, an embodiment of the present disclosure further provides a voltage converter. For a structure of the voltage converter, refer to FIG. 3. The voltage converter may include the multi-phase signal control circuit shown in FIG. 6, FIG. 8, or FIG. 11, and the power stage circuit shown in FIG. 15. The multi-phase signal control circuit may be configured to generate a first phase signal and a second phase signal based on a feedback control signal fed back by the power stage circuit. The power stage circuit may be configured to generate an output voltage signal based on the first phase signal and the second phase signal. For specific descriptions of the multi-phase signal control circuit and the power stage circuit, refer to the foregoing descriptions. Details are not described again in this embodiment of the present disclosure.

In another possible embodiment, the present disclosure further provides a voltage converter chip. For a structure of the voltage converter chip, refer to FIG. 3. The voltage converter chip may include the multi-phase signal control circuit shown in FIG. 6, FIG. 8, or FIG. 11. Further, the voltage converter chip may further include a power stage circuit, and a structure of the power stage circuit may be as shown in FIG. 15.

In another possible embodiment, the present disclosure further provides a communications device. The device may be a terminal or a base station. The device may include a processing chip and the voltage converter chip provided above. The voltage converter chip is configured to supply power to the processing chip.

Figure 16:
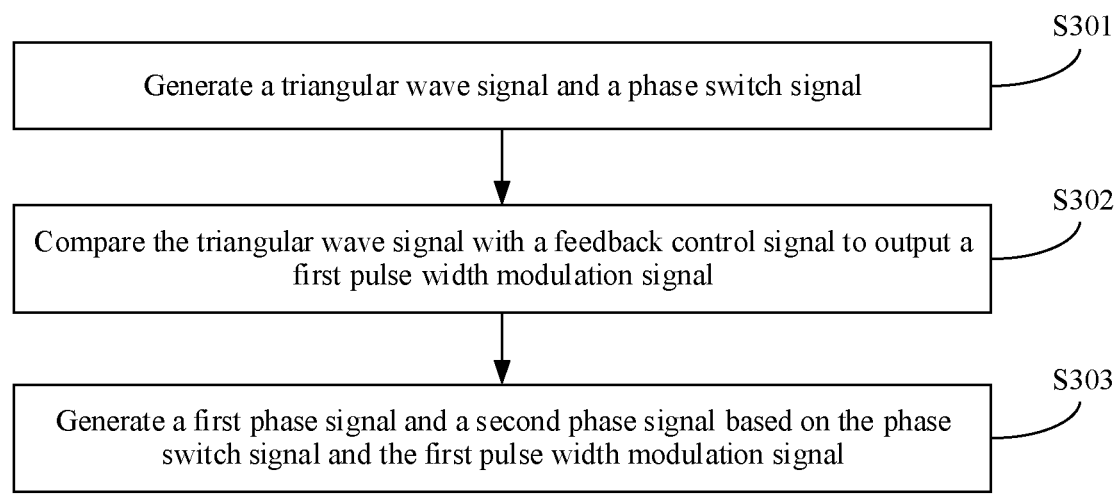
FIG. 16 is a schematic flowchart of a multi-phase signal control method according to an embodiment of the present disclosure.

FIG. 16 is a multi-phase signal control method according to an embodiment of the present disclosure. The method includes the following steps S301 to S303.

S301: Generate a triangular wave signal and a phase switch signal.

The generating a triangular wave signal and a phase switch signal may be specifically: generating the triangular wave signal, and generating a trigger signal based on the triangular wave signal; and performing frequency division processing on the trigger signal to obtain the phase switch signal, where a position of a transition edge of the trigger signal corresponds to a position of a peak or a valley of the triangular wave signal, a frequency of the phase switching signal is N times a frequency of the triangular wave signal, and N is an integer greater than or equal to 1.

S302: Compare the triangular wave signal with a feedback control signal to output a first pulse width modulation signal, where the feedback control signal is related to an error between an output voltage signal and a preset voltage signal.

S303: Generate a first phase signal and a second phase signal based on the phase switch signal and the first pulse width modulation signal. A result of logical OR processing performed on the first phase signal and the second phase signal is the first pulse width modulation signal, and the first phase signal and the second phase signal are used to generate the output voltage signal.

Further, the method further includes: latching the first pulse width modulation signal to generate a second pulse width modulation signal. Correspondingly, the generating a first phase signal and a second phase signal based on the phase switch signal and the first pulse width modulation signal is specifically: generating the first phase signal and the second phase signal based on the phase switch signal and the second pulse width modulation signal. In a possible implementation, the method further includes: generating a pulse hold signal, where a position of a high-level pulse width of the pulse hold signal may correspond to a position of a high-level pulse width of the trigger signal. Correspondingly, the latching the first pulse width modulation signal to generate a second pulse width modulation signal may be specifically: latching the first pulse width modulation signal based on the pulse hold signal, to output the second pulse width modulation signal. Optionally, the high-level pulse width of the pulse hold signal is equal to any one of the following: twice a minimum off-time, twice a minimum on-time, or twice a larger value between a minimum off-time and a minimum on-time.

Correspondingly, the generating a first phase signal and a second phase signal based on the phase switch signal and the first pulse width modulation signal in S303 is specifically: performing a logical AND operation on the phase switch signal and the second pulse width modulation signal to output the first phase signal; and performing a logical NOT operation on the phase switch signal, and performing a logical AND operation on a signal obtained after the logical NOT operation and the second pulse width modulation signal to output the second phase signal.

In a possible implementation, the generating the triangular wave signal and a trigger signal having a same frequency as the triangular wave signal may be specifically: generating an oscillation signal; buffering the oscillation signal to output a clock signal; delaying the clock signal by a first phase to output the trigger signal; and performing integration processing on the trigger signal to output the triangular wave signal.

In another possible implementation, the generating the triangular wave signal and a trigger signal having a same frequency as the triangular wave signal may be specifically: generating a clock signal, and generating the triangular wave signal based on the clock signal; and delaying the clock signal by a first phase to output the trigger signal.

Further, the generating a pulse hold signal may be specifically: delaying the clock signal by a second phase to output a clock delay signal, where the second phase is equal to twice the first phase; and respectively inputting the clock signal and the clock delay signal to a clock input and a set input of a D flip-flop to generate the pulse hold signal. Alternatively, the generating a pulse hold signal may be specifically: delaying the clock signal by a second phase to output a clock delay signal, where the second phase is equal to twice the first phase; and performing a logical NOT operation on the clock delay signal, and performing a logical AND operation on a signal obtained after the logical NOT operation and the clock signal to generate the pulse hold signal.

It should be noted that, for detailed descriptions of the multi-phase signal control method provided in this embodiment of the present disclosure, refer to corresponding descriptions in the foregoing multi-phase signal control circuit. Details are not described again in this embodiment of the present disclosure.

In this embodiment of the present disclosure, the generated phase switch signal does not depend on a first PWM signal, that is, the phase switch signal is not affected by a change in an on-off cycle controlled by the first PWM signal. Therefore, when the on-off cycle controlled by the first PWM signal is unstable, the first phase signal and the second phase signal that control alternate charge and discharge can still be stably generated by performing phase switching on the first PWM signal using the phase switch signal. The first phase signal and the second phase signal may meet a normal working condition of a downstream power stage circuit, so that the power stage circuit can generate a stable output voltage signal based on the first phase signal and the second phase signal, and can also ensure a loading capability of a voltage converter and stability of an output ripple.

In the several embodiments provided in the present disclosure, it should be understood that the disclosed circuit and method may be implemented in another manner. For example, the described circuit embodiment is merely an example. For example, the described division into the modules or units is merely logical function division, and may be other division in actual implementation. For example, a plurality of units or components may be combined, or may be integrated into another apparatus, or some features may be ignored or not performed.

The units described as separate parts may or may not be physically separate, and parts displayed as units may be one or more physical units, may be located in one place, or may be distributed at different places. Some or all of the units may be selected based on an actual requirement to achieve an objective of the solutions of the embodiments.

Finally, it should be noted that the foregoing descriptions are merely specific implementations of the present disclosure. However, the protection scope of the present disclosure is not limited thereto. Any variation or replacement within the technical scope disclosed in the present disclosure shall fall within the protection scope of the present disclosure. Therefore, the protection scope of the present disclosure shall be subject to the protection scope of the claims.

What is claimed is:

1. A multi-phase signal control circuit, comprising:
   a signal generator, configured to generate a triangular wave signal and a trigger signal having a same frequency as the triangular wave signal; and
   a frequency divider, configured to perform frequency division processing on the trigger signal to obtain a phase switch signal;
   a comparator, coupled to receive the triangular wave signal and a feedback control signal produced by a power stage circuit, the comparator configured to compare the triangular wave signal with the feedback control signal to output a first pulse width modulation signal; and
   a phase switch circuit, coupled to receive the phase switch signal and the first pulse width modulation signal, and configured to generate a first phase signal and a second phase signal, wherein the first phase signal and the second phase signal are control signals for the power stage circuit.

2. The multi-phase control circuit of claim 1, wherein the multi-phase signal control circuit further comprises:
   a latch, configured to latch the first pulse width modulation signal to generate a second pulse width modulation signal, and output the second pulse width modulation signal to the phase switch circuit.

3. The multi-phase control circuit of claim 2, wherein the phase switch circuit comprises:
   a first AND gate, configured to perform a logical AND operation on the phase switch signal and the second pulse width modulation signal to output the first phase signal;
   a first NOT gate, configured to perform a logical NOT operation on the phase switch signal; and
   a second AND gate, configured to perform a logical AND operation on a signal obtained after the logical NOT operation and the second pulse width modulation signal, to output the second phase signal.

4. The multi-phase control circuit of claim 1, wherein the signal generator comprises:
   a ring oscillator, configured to generate an oscillation signal;
   a buffer, configured to buffer the oscillation signal to output a clock signal;
   a first delay circuit, configured to delay the clock signal by a first phase to output the trigger signal; and
   an integrator circuit, configured to perform integration processing on the trigger signal to output the triangular wave signal.

5. The multi-phase control circuit of claim 1, wherein the signal generator comprises:
   a relaxation oscillator, configured to generate a clock signal, and generate the triangular wave signal based on the clock signal; and
   a first delay circuit, configured to receive the clock signal, and delay the clock signal by a first phase to output the trigger signal.

6. The multi-phase control circuit of claim 2, wherein the signal generator is further configured to:
   generate a pulse hold signal, and output the pulse hold signal to an enable end of the latch, wherein a position of a high-level pulse width of the pulse hold signal corresponds to a position of a high-level pulse width of the trigger signal.

7. The multi-phase control circuit of claim 6, wherein the signal generator further comprises:
   a second delay circuit, configured to receive the clock signal, and delay the clock signal by a first phase to output the trigger signal; and
   a D flip-flop, configured to:
     receive the clock signal through a clock input;
     receive the clock delay signal through a set input; and
     generate the pulse hold signal based on the clock signal and the clock delay signal.

8. The multi-phase control circuit of claim 6, wherein the signal generator further comprises:
   a second delay circuit, configured to delay the clock signal by a second phase to output a clock delay signal, wherein the second phase is equal to twice the first phase; and
   a logical operation circuit, configured to perform a logical NOT operation on the clock delay signal, and perform a logical AND operation on a signal obtained after the logical NOT operation and the clock signal, to generate the pulse hold signal.

9. The multi-phase control circuit of claim 6, wherein the high-level pulse width of the pulse hold signal is equal to any one of the following: twice a minimum off-time, twice a minimum on-time, or twice a larger value between a minimum off-time and a minimum on-time.

10. A method performed by a multi-phase signal control circuit, comprising:
generating a triangular wave signal and a trigger signal having a same frequency as the triangular wave signal;
performing frequency division processing on the trigger signal to obtain a phase switch signal;
comparing the triangular wave signal with a feedback control signal produced by a power stage circuit to output a first pulse width modulation signal, wherein the feedback control signal is related to an error between an output voltage signal and a preset voltage signal; and
generating a first phase signal and a second phase signal based on the phase switch signal and the first pulse width modulation signal, wherein the first phase signal and the second phase signal are control signals for the power stage circuit.

11. The method of claim 10, wherein the method further comprises: latching the first pulse width modulation signal to generate a second pulse width modulation signal; and
the generating a first phase signal and a second phase signal based on the phase switch signal and the first pulse width modulation signal is specifically: generating the first phase signal and the second phase signal based on the phase switch signal and the second pulse width modulation signal.

12. The method of claim 11, wherein the generating the first phase signal and the second phase signal based on the phase switch signal and the second pulse width modulation signal comprises:
performing a logical AND operation on the phase switch signal and the second pulse width modulation signal to output the first phase signal; and
performing a logical NOT operation on the phase switch signal, and performing a logical AND operation on a signal obtained after the logical NOT operation and the second pulse width modulation signal, to output the second phase signal.

13. The method of claim 12, wherein the generating the triangular wave signal and a trigger signal having a same frequency as the triangular wave signal comprises:
generating an oscillation signal;
buffering the oscillation signal to output a clock signal;
delaying the clock signal by a first phase to output the trigger signal; and
performing integration processing on the trigger signal to output the triangular wave signal.

14. A communications device, comprising:
a processing chip; and
a voltage converter chip configured to supply power to the processing chip, the voltage converter chip comprises:
a signal generator, configured to generate a triangular wave signal and a trigger signal having a same frequency as the triangular wave signal; and
a frequency divider, configured to perform frequency division processing on the trigger signal to obtain a phase switch signal;
a comparator, coupled to receive the triangular wave signal and a feedback control signal produced by a power stage circuit, the comparator configured to compare the triangular wave signal with the feedback control signal to output a first pulse width modulation signal; and
a phase switch circuit, coupled to receive the phase switch signal and the first pulse width modulation signal, and configured to generate a first phase signal and a second phase signal, wherein the first phase signal and the second phase signal are control signals for the power stage circuit.

15. The communications device of claim 14, wherein the multi-phase signal control circuit further comprises:
a latch, configured to latch the first pulse width modulation signal to generate a second pulse width modulation signal, and output the second pulse width modulation signal to the phase switch circuit.

16. The communications device of claim 14, wherein the signal generator comprises:
a ring oscillator, configured to generate an oscillation signal;
a buffer, configured to buffer the oscillation signal to output a clock signal;
a first delay circuit, configured to delay the clock signal by a first phase to output the trigger signal; and
an integrator circuit, configured to perform integration processing on the trigger signal to output the triangular wave signal.

17. The communications device of claim 14, wherein the signal generator comprises:
a relaxation oscillator, configured to generate a clock signal, and generate the triangular wave signal based on the clock signal; and
a first delay circuit, coupled to receive the clock signal, and delay the clock signal by a first phase to and configured to output the trigger signal.

18. The multi-phase control circuit of claim 1, wherein a frequency of the phase switch signal is N times a frequency of the triangular wave signal, wherein N is an integer greater than or equal to 1; and
a result of logical OR processing performed on the first phase signal and the second phase signal is the first pulse width modulation signal.

19. The method of claim 10, wherein a frequency of the phase switch signal is N times a frequency of the triangular wave signal, wherein N is an integer greater than or equal to 1; and
a result of logical OR processing performed on the first phase signal and the second phase signal is the first pulse width modulation signal.

20. The communications device of claim 14, wherein a frequency of the phase switch signal is N times a frequency of the triangular wave signal, wherein N is an integer greater than or equal to 1; and
a result of logical OR processing performed on the first phase signal and the second phase signal is the first pulse width modulation signal.

* * * * *